(12) United States Patent
Yu et al.

(10) Patent No.: US 11,916,028 B2
(45) Date of Patent: Feb. 27, 2024

(54) PACKAGE STRUCTURE AND METHOD OF FORMING THE SAME

(71) Applicant: Taiwan Semiconductor Manufacturing Company, Ltd., Hsinchu (TW)

(72) Inventors: Chen-Hua Yu, Hsinchu (TW); Chun-Hui Yu, Hsinchu County (TW); Kuo-Chung Yee, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 226 days.

(21) Appl. No.: 17/378,796

(22) Filed: Jul. 19, 2021

(65) Prior Publication Data
US 2021/0343666 A1 Nov. 4, 2021

Related U.S. Application Data

(63) Continuation of application No. 16/714,814, filed on Dec. 16, 2019, now Pat. No. 11,069,636, which is a continuation of application No. 16/219,981, filed on Dec. 14, 2018, now Pat. No. 10,510,695, which is a continuation of application No. 15/662,279, filed on Jul. 27, 2017, now Pat. No. 10,157,864.

(51) Int. Cl.
*H01L 23/48* (2006.01)
*H01L 23/00* (2006.01)
(Continued)

(52) U.S. Cl.
CPC .......... *H01L 24/02* (2013.01); *H01L 23/3114* (2013.01); *H01L 23/3128* (2013.01); *H01L 24/12* (2013.01); *H01L 24/19* (2013.01); *H01L 24/20* (2013.01); *H01L 25/065* (2013.01); *H01L 24/48* (2013.01); *H01L 2224/024* (2013.01); *H01L 2224/02331* (2013.01); *H01L 2224/02379* (2013.01); *H01L 2224/12105* (2013.01);
(Continued)

(58) Field of Classification Search
CPC .......... H01L 24/03; H01L 2224/12105; H01L 2224/02331; H01L 2224/02379; H01L 23/5389
USPC ................................................ 257/773, 786
See application file for complete search history.

(56) References Cited

U.S. PATENT DOCUMENTS 8,980,691 B2 * 3/2015 Lin ........................ H01L 25/50
438/666
9,000,584 B2 4/2015 Lin et al.
(Continued)

*Primary Examiner* — Nitin Parekh
(74) *Attorney, Agent, or Firm* — JCIPRNET

(57) ABSTRACT

A package structure and a method of forming the same are provided. The package structure includes a die, an encapsulant and a RDL structure, the encapsulant encapsulate sidewalls of the die. The RDL structure is disposed on the die and the encapsulant. The RDL structure includes a first dielectric structure and a first redistribution layer. The first dielectric structure includes a first dielectric material layer and a second dielectric material layer on the first dielectric material layer. The first redistribution layer is embedded in the first dielectric structure and electrically connected to the die, the redistribution layer comprises a first seed layer and a first conductive layer disposed on the first seed layer. A topmost surface of the first seed layer and a topmost surface of the first conductive layer are substantially level with a top surface of the second dielectric material layer.

20 Claims, 32 Drawing Sheets

(51) Int. Cl.
   *H01L 23/31*     (2006.01)
   *H01L 25/065*    (2023.01)
(52) U.S. Cl.
   CPC .............. *H01L 2224/18* (2013.01); *H01L 2224/48091* (2013.01); *H01L 2224/48227* (2013.01); *H01L 2224/48464* (2013.01); *H01L 2924/00014* (2013.01); *H01L 2924/10252* (2013.01); *H01L 2924/10253* (2013.01); *H01L 2924/10272* (2013.01); *H01L 2924/10329* (2013.01); *H01L 2924/1203* (2013.01); *H01L 2924/1304* (2013.01); *H01L 2924/1433* (2013.01); *H01L 2924/181* (2013.01)

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,287,203 B2 * | 3/2016 | Lin | H01L 24/19 |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,728,498 B2 * | 8/2017 | Su | H01L 23/3157 |
| 2008/0150164 A1 * | 6/2008 | Chia | H01L 23/5389 |
| | | | 438/111 |
| 2011/0104888 A1 * | 5/2011 | Kim | H01L 25/0657 |
| | | | 257/E21.585 |
| 2014/0210099 A1 * | 7/2014 | Hu | H01L 23/481 |
| | | | 257/774 |
| 2014/0264842 A1 * | 9/2014 | Lin | H01L 24/20 |
| | | | 257/737 |
| 2016/0233166 A1 * | 8/2016 | Teh | H01L 23/5389 |
| 2018/0151521 A1 * | 5/2018 | Lee | H01L 24/11 |

* cited by examiner

PACKAGE STRUCTURE AND METHOD OF FORMING THE SAME

CROSS-REFERENCE TO RELATED APPLICATION

This application is a continuation application of and claims the priority benefit of a prior application Ser. No. 16/714,814, filed on Dec. 16, 2019, now allowed. The prior application Ser. No. 16/714,814 is a continuation application of and claims the priority benefit of a prior application Ser. No. 16/219,981, filed on Dec. 14, 2018, U.S. Pat. No. 10,510,695B2. The prior application Ser. No. 16/219,981 is a continuation application of and claims the priority benefit of a prior application Ser. No. 15/662,279, filed on Jul. 27, 2017, U.S. Pat. No. 10,157,864B1. The entirety of each of the above-mentioned patent applications is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. In the integrated fan-out packages, the formation of the redistribution circuit structure plays an important role during packaging process.

BRIEF DESCRIPTION OF THE DRAWINGS

FIG. 2A to FIG. 2I are schematic cross-sectional views illustrating a method of forming a package structure according to a first embodiment of the disclosure.

FIG. 3A to FIG. 3K are schematic cross-sectional views illustrating a method of forming a package structure according to a second embodiment of the disclosure.

FIG. 4A to FIG. 4I are schematic cross-sectional views illustrating a method of forming a package structure according to a third embodiment of the disclosure.

DETAILED DESCRIPTION

Figure 1:
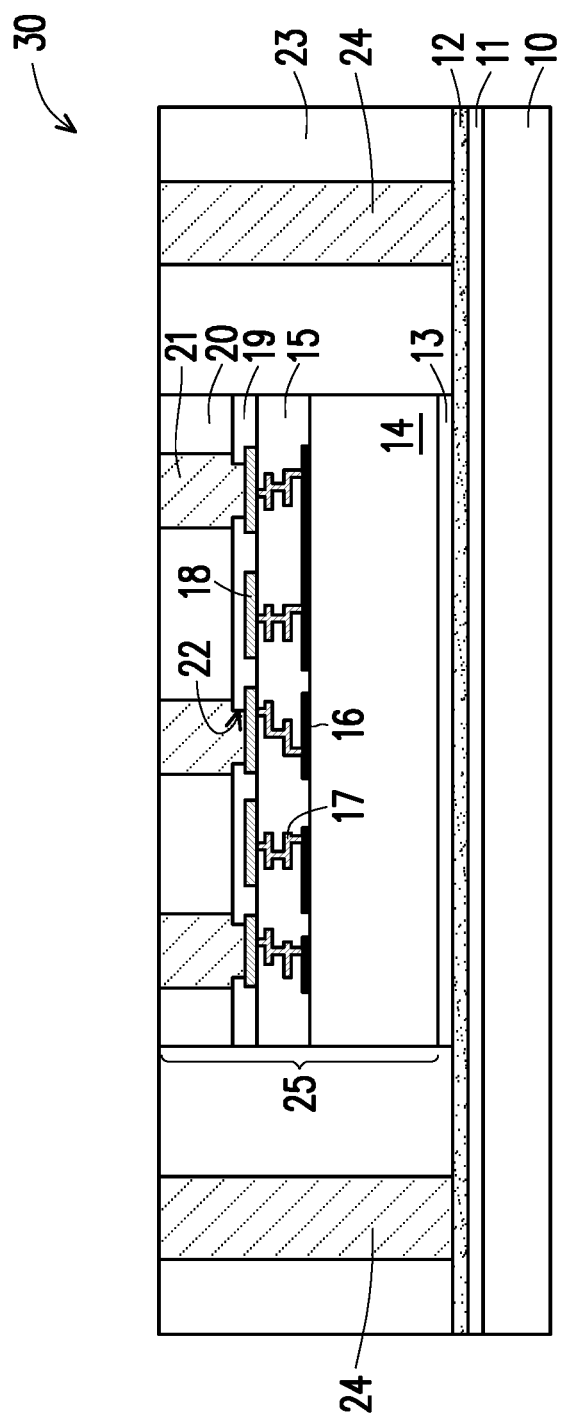
FIG. 1 is schematic cross-sectional view illustrating a structure before a redistribution layer (RDL) structure is formed.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is a schematic cross-sectional view illustrating a structure before a redistribution layer (RDL) structure is formed.

Referring to FIG. 1, a structure 30 is provided. In some embodiments, the structure 30 includes a die 25, a plurality of through integrated fan-out vias (TIV) 24, and an encapsulant 23. The die 25 is one of a plurality of dies cut apart from a wafer, for example. The die 25 may be an application-specific integrated circuit (ASIC) chip, an analog chip, a sensor chip, a wireless and radio frequency chip, a voltage regulator chip or a memory chips. In some embodiments, the die 25 includes a substrate 14, integrated circuit devices 16, an interconnect structure 17, a dielectric layer 15, a plurality of pads 18, a passivation layer 19, a plurality of connectors 21, and a passivation layer 20.

The substrate 14 is a semiconductor substrate such as a silicon substrate. The substrate 14 is, for example, a bulk silicon substrate, a doped silicon substrate, an undoped silicon substrate, or a silicon-on-insulator (SOI) substrate. The dopant of the doped silicon substrate may be an N-type dopant, a P-type dopant or a combination thereof. The substrate 14 may also be formed by the other semiconductor materials. The other semiconductor materials include but are not limited to silicon germanium, silicon carbide, gallium arsenide, or the like. The substrate 14 includes active areas and isolation structures (not shown). The integrated circuit devices 16 are formed in the active areas of the substrate 14. The integrated circuit devices 16 are, for example, transistors, capacitors, resistors, diodes, photodiodes, fuse devices, or other similar devices.

The dielectric layer 15 and the interconnect structure 17 are formed over the integrated circuit devices 16. The interconnect structure 17 is formed in the dielectric layer 15 and connected to different integrated circuit devices 16 to form a functional circuit. In some embodiments, the dielectric layer 15 includes an inter-layer dielectric layer (ILD) and one or more inter-metal dielectric layers (IMD). In some embodiments, the interconnect structure 17 includes multiple layers of metal lines and plugs. The metal lines and plugs include conductive materials. The plugs include contact plugs and via plugs. The contact plugs are located in the ILD to be connected to the metal lines and the integrated circuit devices 16; the via plugs are located in the IMD to be connected to the metal lines in different layers.

The pads 18 are formed over or on the interconnect structure 17. The pads 18 and the interconnect structure 17 are electrically connected to provide an external connection to the integrated circuit devices 16. The material of the pads 18 may include metal or metal alloy, such as aluminum, copper, nickel, or alloys thereof.

The passivation layer 19 is formed over the substrate 14 and covers a portion of the pads 18. The passivation layer 19 may be a single layer structure or a multilayer structure. The passivation layer 19 includes an insulating material such as silicon oxide, silicon nitride, polymer, or a combination thereof. The polymer is, for instance, polybenzoxazole (PBO), polyimide, benzocyclobutene (BCB), a combination thereof, or the like. The passivation layer 19 has an opening 22 exposing a portion of the pads 18. The passivation layer 19 is formed by forming a passivation material layer over the substrate 14 by a suitable fabrication technique such as spin-coating, lamination, deposition, or the like. Thereafter, the passivation material layer is patterned by a photolithography process and an etching process to form the opening 22.

The connectors 21 are formed over and electrically connected to some of the pads 18 exposed by the openings 22. The connectors 21 are electrically connected to the integrated circuit devices 16 through the pads 18 and the interconnect structure 17. The connectors 21 include solder bumps, gold bumps, copper bumps, copper posts, or the like. The term "copper posts" refers to copper protrusions, copper through vias, thick copper pads, and/or copper-containing protrusions. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum, or zirconium, etc. The connectors 21 are formed by physical vapor deposition (PVD) or electroplating, for example.

The passivation layer 20 is formed over the passivation layer 19 and aside the connectors 21 to cover the sidewalls of the connectors 21. The passivation layer 20 may be a single layer structure or a multilayer structure. The passivation layer 20 includes an insulating material such as silicon oxide, silicon nitride, polymer, or a combination thereof. The polymer is, for instance, photosensitive polybenzoxazole (PBO), polyimide, benzocyclobutene (BCB), a combination thereof, or the like. The passivation layer 20 is formed by forming a passivation material layer over the substrate 14 by a suitable fabrication technique such as spin-coating, lamination, deposition, or the like. Thereafter, the passivation material layer is planarized by a planarization process such as a chemical mechanical polishing (CMP) method. In some embodiment, the surface of the passivation layer 20 is substantially level with the surface of the connectors 21.

In some embodiments, an adhesive layer 13 is provided over the back side of the die 25 (that is, the side away from the connectors 21). The adhesive layer 13 includes a die attach film (DAF), silver paste, or the like.

The die 25 with the adhesive layer 13 is placed over a carrier 10. In some embodiments, one die 25 is placed over the carrier 10 (shown in FIG. 1). In some other embodiments, two or more dies 25 are placed side by side over the carrier 10 (shown in FIG. 9). The carrier 10 is provided with a glue layer 11 and a dielectric layer 12 formed thereon. The adhesive layer 13 on the back side of the die 25 is attached to the dielectric layer 12 over the carrier 10. The carrier 10 may be a blank glass carrier, a blank ceramic carrier, or the like. The glue layer 11 may be formed of an adhesive such as an Ultra-Violet (UV) glue, a Light-to-Heat Conversion (LTHC) glue, or the like, or other types of adhesives. In some embodiments, the glue layer 11 is decomposable under the heat of light to thereby release the carrier 10 from the structure 30.

The dielectric layer 12 is formed over the glue layer 11. In some embodiments, the dielectric layer 12 is a polymer layer. The polymer includes, for example, polyimide, PBO, BCB, Ajinomoto Buildup Film (ABF), Solder Resist film (SR), or the like. The dielectric layer 12 is formed by a suitable fabrication technique such as spin-coating, lamination, deposition, or the like.

Thereafter, the plurality of TIVs 24 is formed over the carrier 10 aside the die 25. In some embodiments, the TIVs 24 are formed over the dielectric layer 12. The TIVs 24 include copper, nickel, solder, alloys thereof, or the like. In some embodiments, the TIVs 24 further include a barrier layer (not shown) to prevent metal diffusion. An exemplary forming method of the TIVs 24 includes forming a photoresist layer such as a dry film resist over the carrier 10. Thereafter, openings are formed in the photoresist layer, and the TIVs 24 are then formed in the openings by electroplating. Afterwards, the photoresist layer is stripped. In some embodiments, the top surface of the TIVs 24 is substantially level with the top surface of the connectors 21.

The encapsulant 23 is then formed over the carrier 10 to encapsulate the sidewalls of the die 25 and the TIVs 24. In some embodiments, the encapsulant 23 includes a molding compound, a molding underfill, a resin such as epoxy, a combination thereof, or the like. In some embodiments, the encapsulant 23 includes a photo-sensitive material such as PBO, polyimide, BCB, a combination thereof, or the like, which may be easily patterned by exposure and development processes. In alternative embodiments, the encapsulant 23 includes nitride such as silicon nitride, oxide such as silicon oxide, phosphosilicate glass (PSG), borosilicate glass (BSG), boron-doped phosphosilicate glass (BPSG), a combination thereof, or the like. The encapsulant 23 is formed by forming an encapsulant material layer over the carrier 10 by a suitable fabrication technique such as spin-coating, lamination, deposition, or similar processes. The encapsulant material layer encapsulates the top surfaces and sidewalls of the die 25 and the TIVs 24. Thereafter, a grinding or polishing process is performed to remove a portion of the encapsulant material layer, such that the top surfaces of the connectors 21 and the TIVs 24 are exposed.

FIG. 2A to FIG. 2I are schematic cross-sectional views illustrating a forming method of a package structure according to the first embodiment. Further, FIG. 2A to FIG. 2G are schematic cross-sectional views illustrating a method of forming a redistribution layer (RDL) structure on the structure 30 according to the first embodiment. For the sake of brevity, the detailed components of the structure 30 of FIG. 1 are not illustrated in detail in FIGS. 2A-2G, and only the connectors 21 for subsequent packaging processes are shown.

Figure 2A:
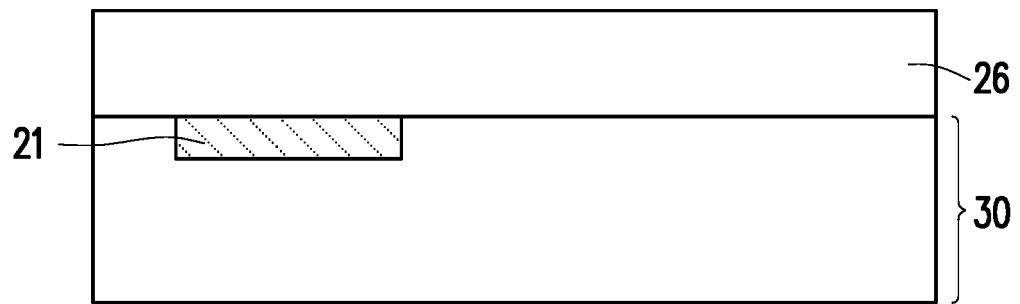

Referring to FIG. 2A, a dielectric layer 26 is formed on the structure 30. In other words, the dielectric layer 26 is formed on the die 25 and the encapsulant 23 shown in FIG. 1. The dielectric layer 26 may be a single layer or a multilayer structure. The material of the dielectric layer 26 includes an inorganic dielectric material, an organic dielectric material, or a combination thereof. The inorganic dielectric material is, for example, silicon oxide, silicon nitride, silicon oxynitride, or a combination thereof. The organic dielectric material includes polymer. In some embodiments, the dielectric layer 26 is a polymer. The polymer includes a photosensitive material, a non-photosensitive material, or a combination thereof. In some embodiments, the photosensitive material includes PBO, polyimide, BCB, positive photoresist, negative photoresist, a combination thereof, and/or the like. The non-photosensitive material includes Ajinomoto buildup film (ABF). The dielectric layer 26 may be formed by chemical vapor deposition, spin coating, or lamination. In some embodiments, the dielectric layer 26 has a thickness in the range of 2 µm to 6 µm.

Figure 2B:
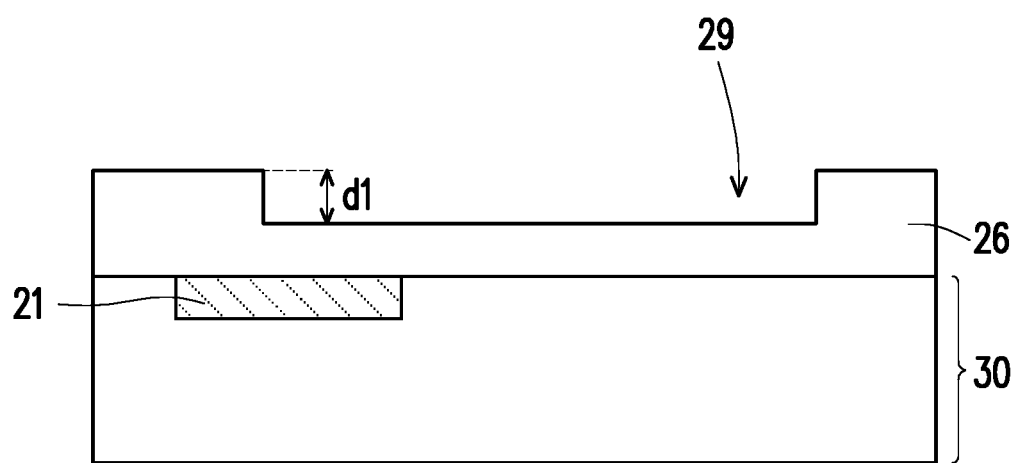

Referring to FIG. 2B, a portion of the dielectric layer 26 is removed to form a trench 29 in the upper portion of the dielectric layer 26, that is, the trench 29 is formed from the top surface of the dielectric layer 26. In some embodiments, the thickness of the removed dielectric layer 26 is ranged from 1 µm to 3 µm. That is, a depth dl of the trench 29 is ranged from 1 µm to 3 µm. In the embodiments in which the dielectric layer 26 is a photosensitive polymer material, the removal method includes exposure and development processes or irradiation with a laser beam. In other embodiments in which the dielectric layer 26 is an inorganic dielectric material or a non-photosensitive polymer material, the removal method includes photolithography and etching processes. The thickness of the removed dielectric layer 26, that is, the depth dl of the trench 29, may be controlled by adjusting the process conditions of the associated removal process.

Figure 2C:
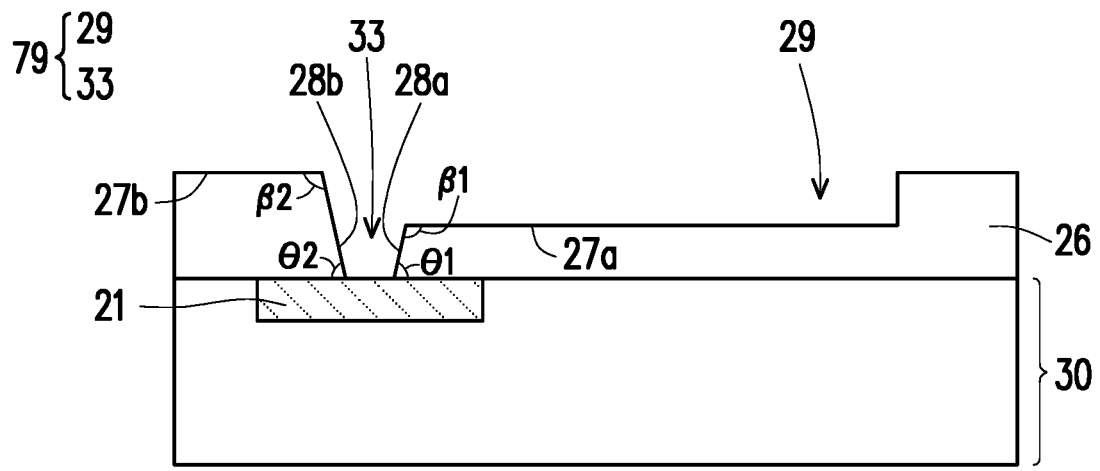

Referring to FIG. 2C, a portion of the dielectric layer 26 is removed to form a via hole 33 in the dielectric layer 26. The removal method may be the same as or different from the method used to remove the dielectric layer 26 when forming the trench 29. In some embodiments in which the dielectric layer 26 is a photosensitive polymer material, the removal method includes exposure and development processes or irradiation with a laser beam. In other embodiments in which the dielectric layer 26 is an inorganic dielectric material or a non-photosensitive polymer material, the removal method includes photolithography and etching processes.

The via hole 33 penetrates through the dielectric layer 26 and exposes a portion of the connectors 21 of the die 25. Furthermore, the via hole 33 is disposed at an end of the trench 29 and in spatial communication with the trench 29 in some embodiments. That is to say, the via hole 33 and the trench 29 form a recess 79 in the dielectric layer 26, and the recess 79 exposes the connectors 21 of the die 25.

FIG. 7A to FIG. 7D are schematic cross-sectional views showing different ways of forming the structure illustrated in FIG. 2C.

Figure 7A:
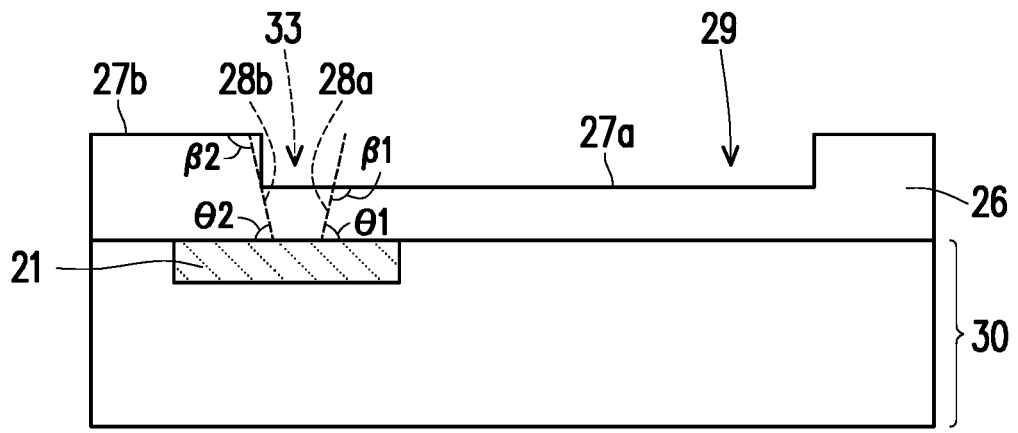
FIG. 7A to FIG. 7D are schematic cross-sectional views showing different ways of forming the structure illustrated in FIG. 2C.
Figure 7B:
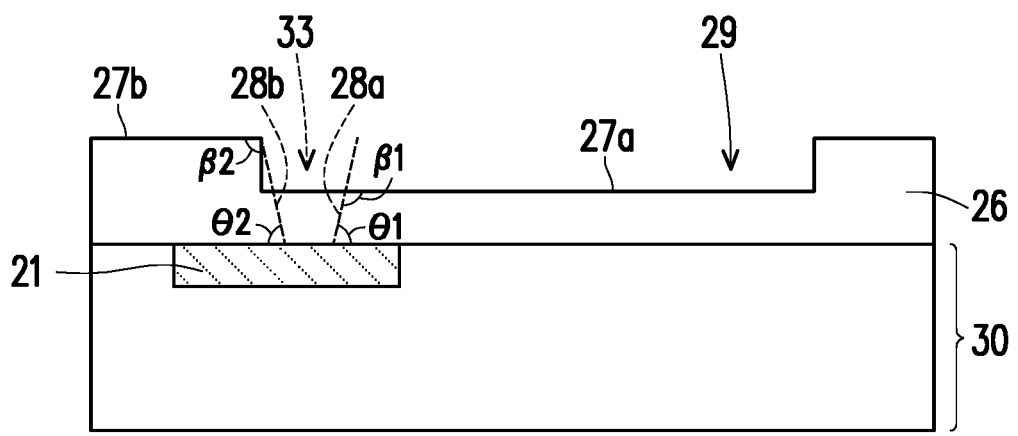
Figure 7C:
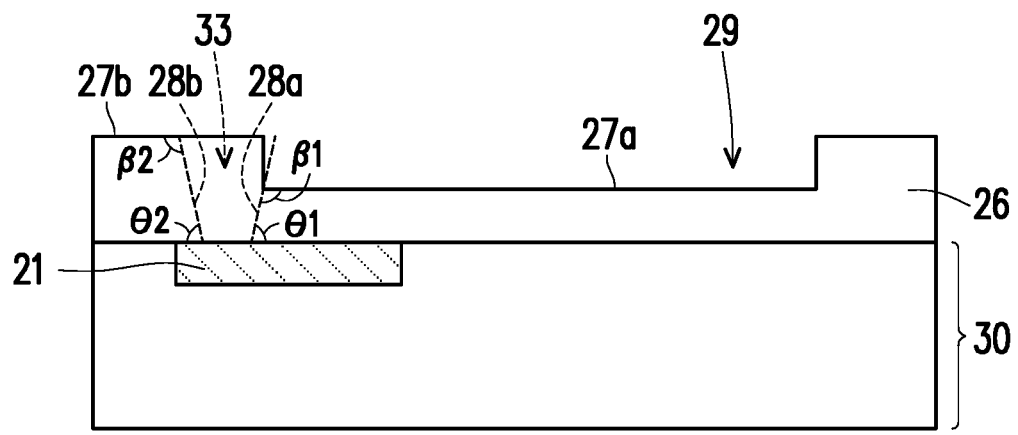
Figure 7D:
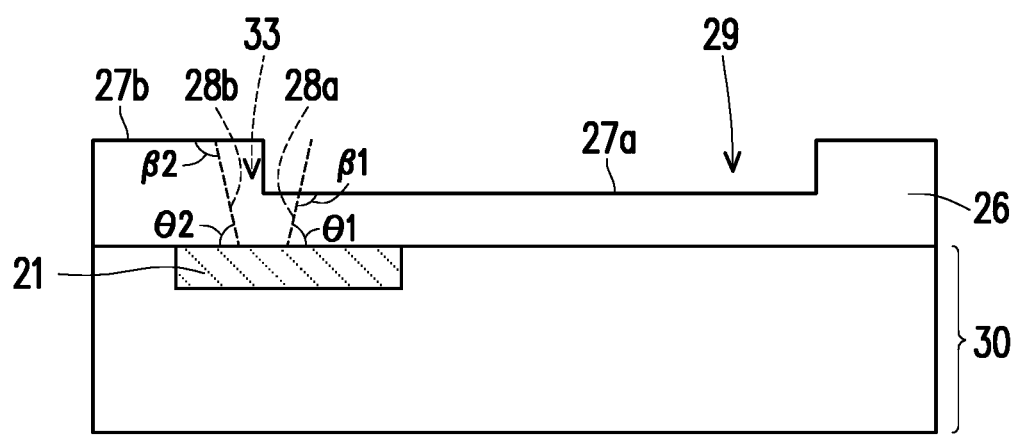

In FIG. 7A, FIG. 7B, FIG. 7C, and FIG. 7D, a region between two dotted lines is the position of the via hole 33 to be formed. The dielectric layer 26 between the two dotted lines is the portion of the dielectric layer 26 to be removed for the formation of the via hole 33. Referring to FIG. 7A, in some embodiments, only the portion of the dielectric layer 26 under one end of the trench 29 is removed so that the edge of the via hole 33 is aligned with one end of the trench 29. Referring to FIG. 7B, in an alternative embodiment, only the portion of the dielectric layer 26 under one end of the trench 29 is removed so that the edge of the via hole 33 is within the edge of one end of the trench 29. Referring to FIG. 7C, in another alternative embodiment, only the portion of the dielectric layer 26 adjacent to one end of the trench 29 is removed so that one edge of the via hole 33 is within the edge of said end of the trench 29. Referring to FIG. 7D, in some other embodiments, not only is the portion of the dielectric layer 26 under said end of the trench 29 removed, but the portion of the dielectric layer 26 adjacent to said end of the trench 29 is also removed, such that the edge of said end of the trench 29 is within the edge of the via hole 33.

Still referring to FIG. 2C, the dielectric layer 26 with the trench 29 and the via hole 33 has a first surface 27a, a second surface 27b, a first sidewall 28a and a second sidewall 28b, and a first corner β1 and a second corner β2. The first surface 27a is the bottom surface of the trench 29, which is lower than the second surface 27b. The second surface 27b is the top surface of the dielectric layer 26. The first sidewall 28a and the second sidewall 28b are the two sidewalls of the via hole 33. The first sidewall 28a of the dielectric layer 26 and the first surface 27a are connected and form the first corner β1. The second sidewall 28b of the dielectric layer 26 and the second surface 27b are connected and form the second corner β2.

Still referring to FIG. 2C and FIG. 7A to FIG. 7D, in some embodiments, the cross-section shape of the via hole 33 is trapezoid or polygon. That is, the first sidewall 28a and the second sidewall 28b may respectively have a single slope, as shown in FIG. 7A, FIG. 7C, and FIG. 7D. In some alternative embodiments, the first sidewall 28a has a single slope, while the second sidewall 28b does not have a single slope, but has two or more slopes as shown in FIG. 7B. In some embodiments, an included angle θ1 exists between the first sidewall 28a and the bottom surface of the dielectric layer 26, and an included angle θ2 exists between the second sidewall 28b and the bottom surface of the dielectric layer 26. The included angle θ1 and the included angle θ2 may be the same or different. The included angles θ1 and θ2 may be adjusted by using different materials for the dielectric layer 26 and controlling the associated removal process conditions. In some embodiments, the included angles θ1 and θ2 are respectively equal to or greater than 45 degrees. In some exemplary embodiments, the included angles θ1 and θ2 are respectively ranging from 85 degrees to 90 degrees.

Figure 2D:
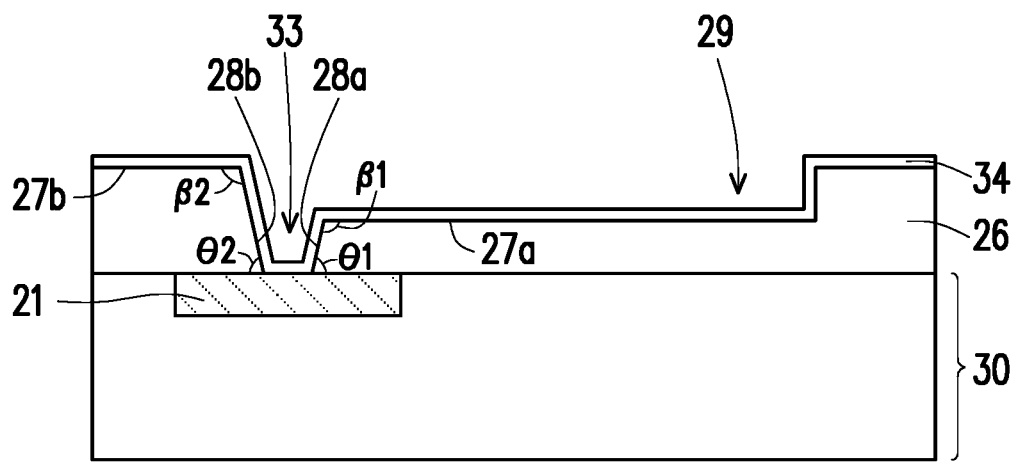

Referring to FIG. 2D, a seed layer 34 is formed on the dielectric layer 26. In some embodiments, the seed layer 34 is a conformal seed layer. The seed layer 34 is, for example, a copper seed layer or other metal seed layers. The forming method thereof includes chemical vapor deposition or physical vapor deposition. The physical vapor deposition is, for example, sputtering. The seed layer 34 covers the surface of the dielectric layer 26 and is filled in the trench 29 and the via hole 33 to cover the bottom surface and sidewalls of the trench 29 and the via hole 33. The seed layer 34 is in contact and electrically connected with the connectors 21 at the bottom surface of the via hole 33. In some embodiments, a barrier layer is further formed on the dielectric layer 26 before the seed layer 34 is formed. The material of the barrier layer includes metal, metal nitride, or a combination thereof. The material of the barrier layer is, for example, titanium, titanium nitride, tantalum nitride, or a combination thereof. The method of forming the barrier layer is, for example, chemical vapor deposition or physical vapor deposition.

Figure 2E:
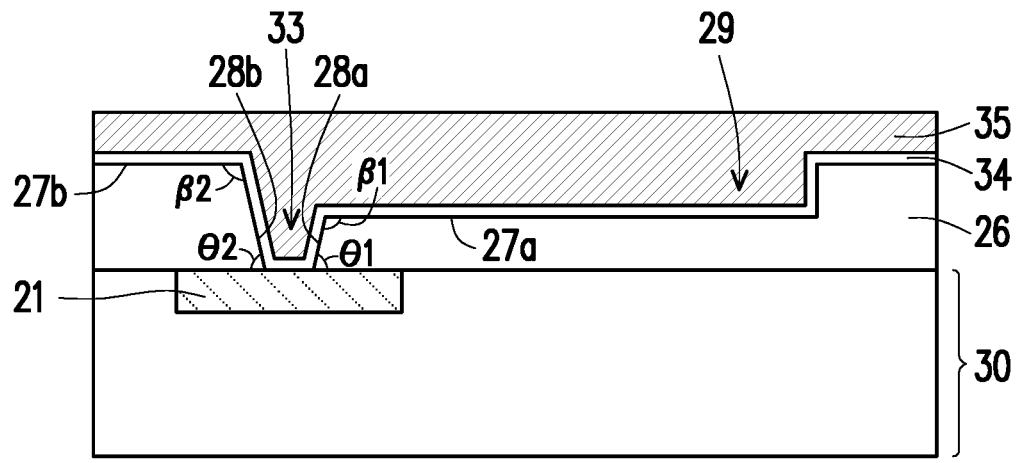

Referring to FIG. 2E, a conductive layer 35 is formed on the seed layer 34 by, for instance, an electroplating process. The conductive layer 35 covers the seed layer 34 and is filled in the trench 29 and the via hole 33. The conductive layer 35 includes, for instance, copper or other suitable metal.

Figure 2F:
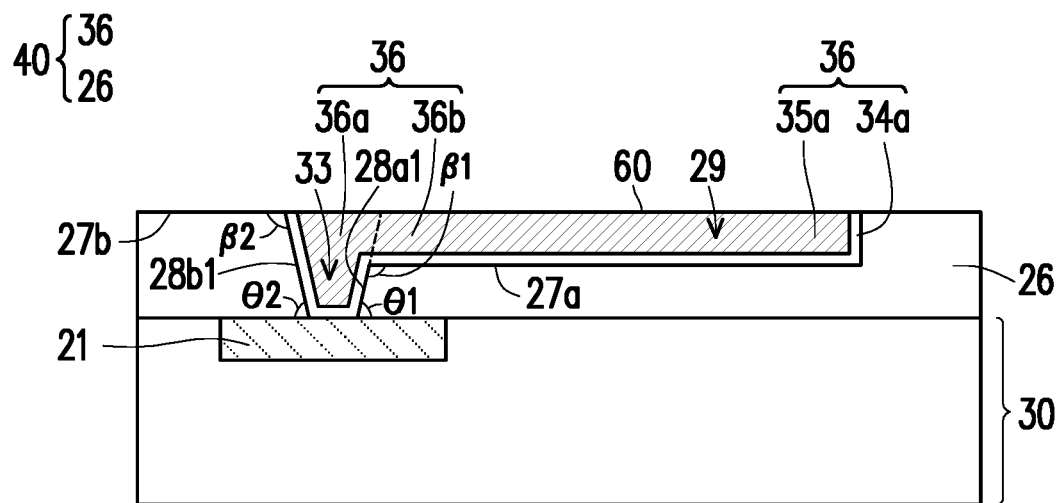

Referring to FIG. 2F, the conductive layer 35 and the seed layer 34 on the second surface 27b of the dielectric layer 26 are removed by a planarization process, such that the second surface 27b of the dielectric layer 26 is exposed, and a conductive layer 35a and a seed layer 34a remain in the trench 29 and the via hole 33. In some embodiments, the second surface 27b of the dielectric layer 26 is completely exposed. In some embodiments, the top surface of the conductive layer 35a, the top surface of the seed layer 34a, and the second surface 27b of the dielectric layer 26 are substantially level with each other and coplanar. The planarization process is, for instance, a chemical mechanical polishing process, an etching process, or a combination thereof.

Still referring to FIG. 2F, the conductive layer 35a and the seed layer 34a form a redistribution layer (RDL) 36. The seed layer 34a surrounds the sidewalls and the bottoms of the conductive layer 35a, and is between the conductive layer 35a and the dielectric layer 26. In other words, the conductive layer 35a and the seed layer 34a disposed in the via hole 33 form a via 36a. The conductive layer 35a and the seed layer 34a disposed in the trench 29 form a trace 36b. The via 36a and the trace 36b form the RDL 36 embedded in the dielectric layer 26. The trace 36b is embedded in the upper portion of the dielectric layer 26. The via 36a is located at an end of the trace 36b, and is in physical contact and electrically connected with the trace 36b and the connectors 21 underlying thereof.

Still referring to FIG. 2F, the first surface 27a and the first corner β1 of the dielectric layer 26 are covered by the RDL 36. The second surface 27b and the second corner β2 of the dielectric layer 26 are not covered by the RDL 36, but exposed. In other words, in some embodiments, a top surface 60 of the RDL 36 and the second surface 27b of the dielectric layer 26 are substantially level with each other and coplanar. In some other embodiments, the top surface 60 of the RDL 36 is slightly lower than the second surface 27b of the dielectric layer 26.

In some embodiments, the RDL 36 is formed in the via hole 33 and the trench 29, and sidewalls 28a1 and 28b1 of the via 36a may respectively have a single slope. In some other embodiments, the sidewall 28a1 has a single slope and the sidewall 28b1 does not have a single slope. The sidewalls 28a1 and 28b1 of the via 36a of the RDL 36 respectively have an included angle θ1 and an included angle θ2 with the bottom surface of the dielectric layer 26. In some embodiments, the included angles θ1 and θ2 are respectively greater than 45 degrees. In some exemplary embodiments, the included angles θ1 and θ2 respectively range from 85 degrees to 90 degrees.

In some embodiments, the RDL 36 and the dielectric layer 26 form an RDL structure 40. The RDL structure 40 may be a single layer or a multilayer structure.

Figure 2G:
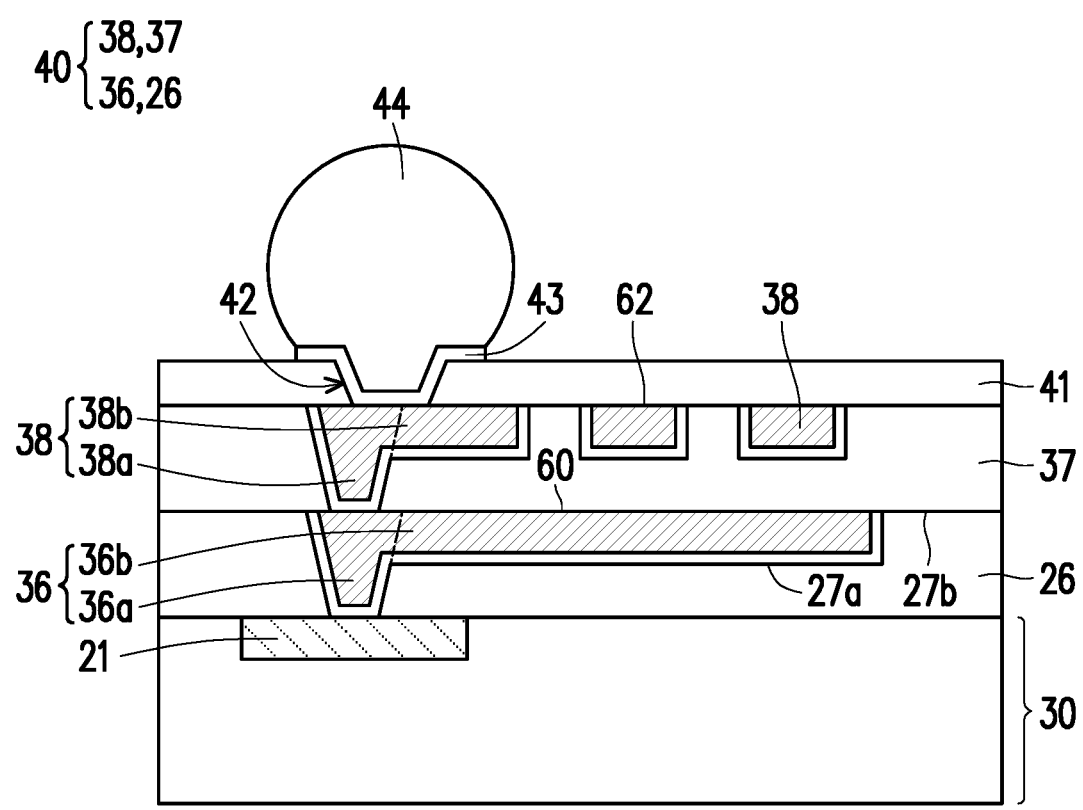

Referring to FIG. 2G, in some embodiments in which the RDL structure 40 is a multilayer structure, the RDL structure 40 includes a plurality of stacked dielectric layers 26/37 and RDLs 36/38 are embedded in each of the dielectric layers 26/37. In some embodiments, the second surface 27b of the dielectric layer 26 is referred as an interface 27b between the dielectric layer 26 and the dielectric layer 37. That is to say, the top surface 60 of the RDL 36 is substantially coplanar with the interface 27b between the dielectric layer 26 and the dielectric layer 37. The RDL 36 and the RDL 38 are electrically connected to each other and the RDL 36 is electrically connected to the connectors 21 of the die 25. The method of forming the multilayer structure of the RDL structure 40 is, for instance, repeating the process from FIG. 2A to FIG. 2F described above to form the dielectric layer 37 and the RDL 38 on the dielectric layer 26 and the RDL 36. The RDL 38 is embedded in the dielectric layer 37. The structural characteristics of the RDL 38 are substantially the same as those of the RDL 36. The RDL 38 includes a via 38a and a trace 38b electrically connected with each other. The via 38a penetrates through the dielectric layer 37, and is in physical contact with and electrically connected to the RDL 36, and is further electrically connected to the connectors 21. In some embodiments, the dielectric layer 26, the RDL 36, the dielectric layer 37, and the RDL 38 form the RDL structure 40. For the sake of brevity, only two layers of the RDL 36/38 are shown in FIG. 2G, but the disclosure is not limited thereto. In some embodiments, the RDL structure 40 further includes one or more alternately stacked RDL embedded in dielectric layer between the RDL 36 and the RDL 38.

Figure 2H:
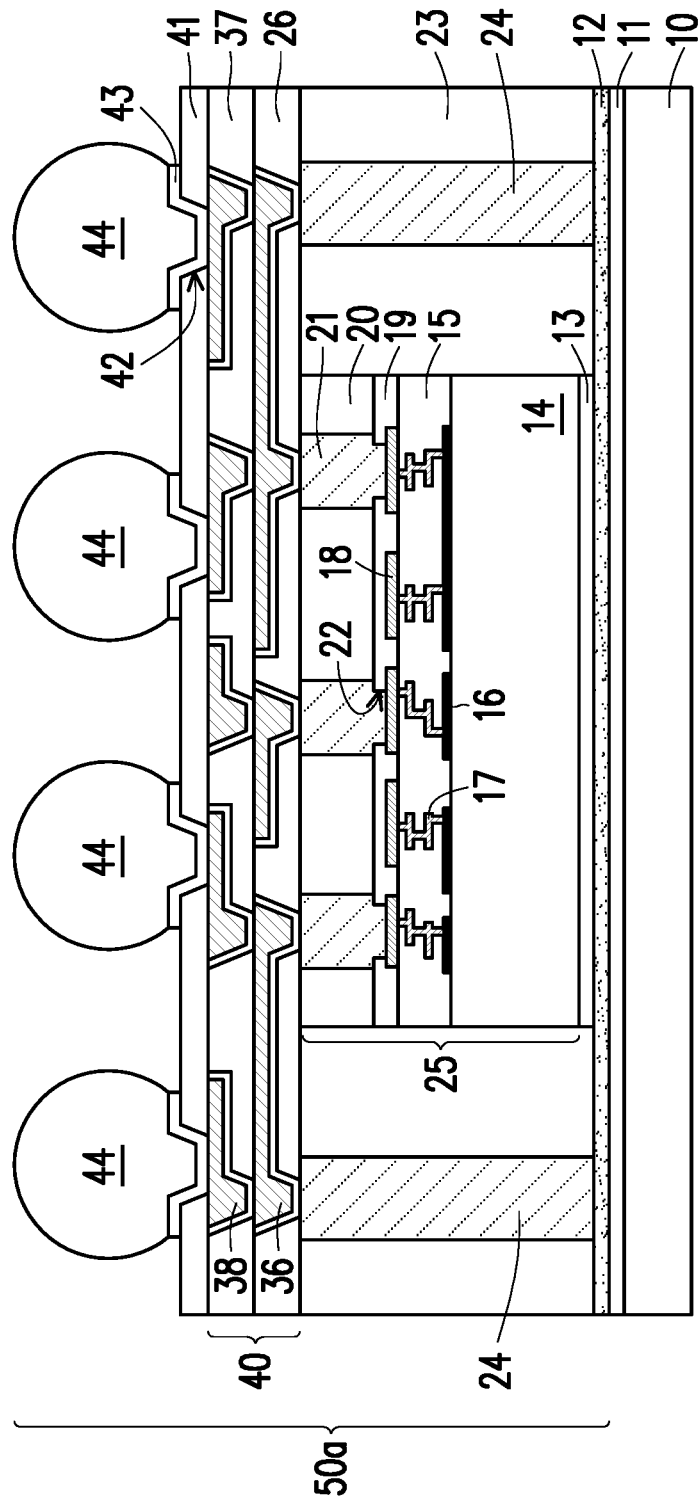
Figure 21:
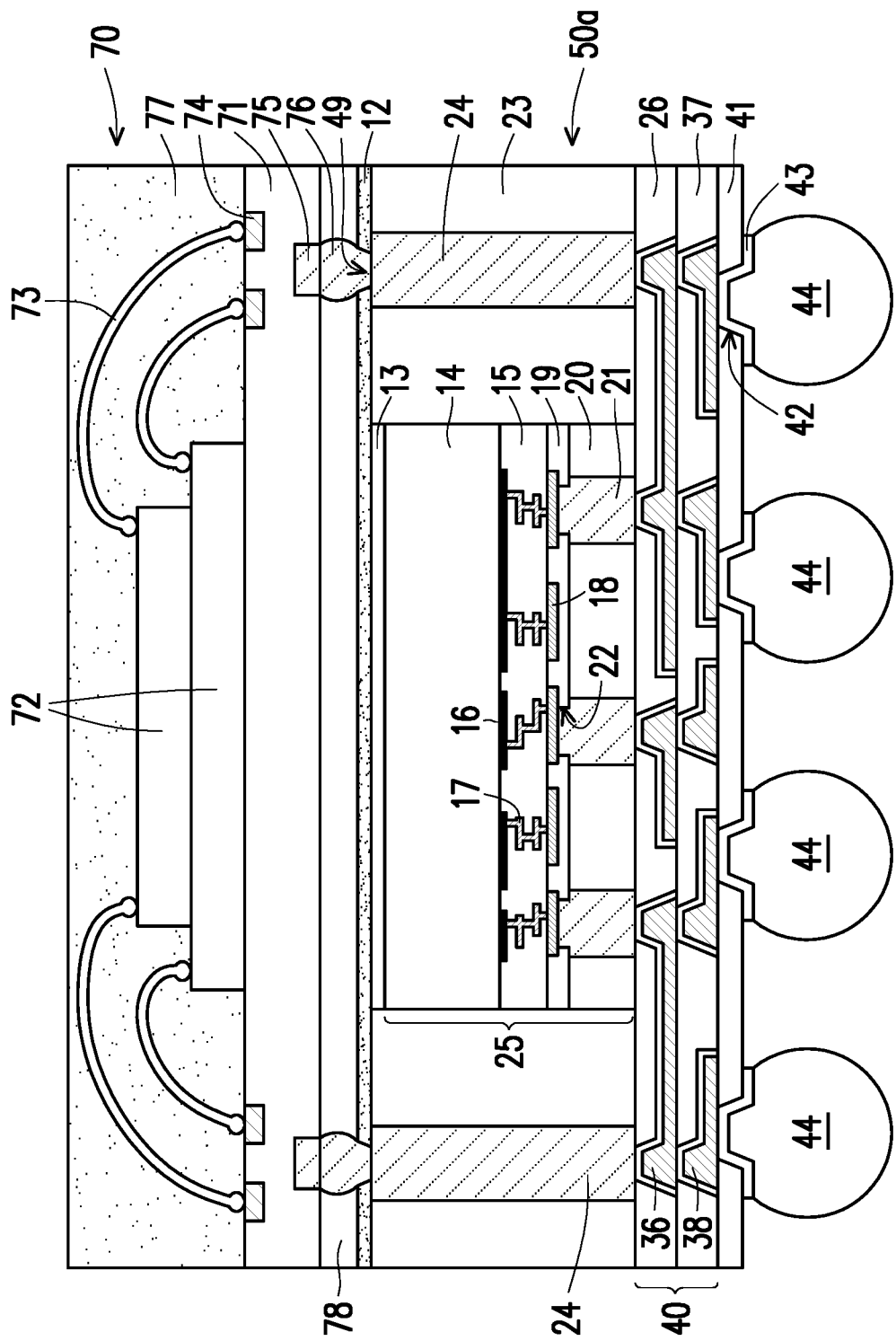

Referring to FIG. 2H, a passivation layer 41 is formed on the RDL structure 40. The passivation layer 41 may be a single layer or a multilayer structure, the material thereof is an insulating material, such as silicon oxide, silicon nitride, a polymer, or a combination thereof. The polymer may be a photosensitive material, a non-photosensitive material, or a combination thereof. The polymer is, for instance, PBO, polyimide, BCB, or a combination thereof. The passivation layer 41 is formed by, for instance, a chemical vapor deposition, spin coating, or a combination thereof. Thereafter, a window 42 is formed in the passivation layer 41. The window 42 exposes a portion of the RDL 38 of the RDL structure 40. In some embodiments, the method of forming the window 42 includes exposure and development processes. In other embodiments, the method of forming the window 42 includes photolithography and etching processes.

Still referring to FIG. 2H, in some embodiments, a conductive layer 43 is formed on the RDL 38 exposed by the window 42. The conductive layer 43 is also referred to as under-ball metallurgy (UBM). In some embodiments, the conductive layer 43 covers the sidewalls and the bottom of the window 42 and extends over the passivation layer 41 to cover the corner of the passivation layer 41. The material of the conductive layer 43 includes a metal or a metal alloy. The conductive layer 43 is, for example, copper, tin, an alloy thereof, or a combination thereof. The conductive layer 43 is formed by, for instance, physical vapor deposition or electroplating. The conductive layer 43 is electrically connected to the connectors 21 of the die 25 through the RDL structure 40.

Thereafter, a plurality of connectors (also referred to as conductive balls) 44 is placed on the conductive layer 43.

The material of the connector 44 includes copper, aluminum, lead-free alloys (e.g., gold, tin, silver, aluminum, or copper alloys) or lead alloys (e.g., lead-tin alloys). In some embodiments, the connectors 44 are placed on the conductive layer 43 by a ball mounting process. The connectors 44 are electrically connected to the connectors 21 through the conductive layer 43 and the RDL structure 40.

Referring to FIG. 2H, the package structure 50a of the first embodiment of the disclosure is thus completed. The package structure 50a is disposed over the carrier 10. The package structure 50a includes the die 25, the encapsulant 23, the TIVs 24, the RDL structure 40, and the connectors 44. The connectors 44 are electrically connected to the connectors 21 of the die 25 and the TIVs 24 in the encapsulant 23 through the RDL structure 40. The area of the RDL structure 40 projected to a top surface of the carrier 10 is larger than the area of the die 25 projected to the top surface of the carrier 10.

The RDL structure 40 is located on the encapsulant 23 and the die 25. In some embodiments, the RDL structure 40 includes the RDL 36 embedded in the dielectric layer 26 and the RDL 38 embedded in the dielectric layer 37. The RDL 36 includes the via 36a and the trace 36b. The RDL 38 includes the via 38a and the trace 38b. The structure of the RDL 38 is substantially the same as the structure of the RDL 36. In the RDL 36, the trace 36b is embedded in the upper portion of the dielectric layer 26, and the via 36a is embedded in the dielectric layer 26 and disposed at an end of the trace 36b to be in contact with and electrically connected to the connectors 21 of the die 25. In some embodiments, the top surfaces 60 of the via 36a and the trace 36b and the second surface 27b of the dielectric layer 26 are substantially level with each other and coplanar. There is no via pad formed on the via 36a/38a to connect thereto. In other words, the top surface of the via 36a and the top surface of the trace 36b are a top surface 60 of the RDL 36. The top surface of the via 38a and the top surface of the trace 38b are a top surface 62 of the RDL 38. The top surfaces 60 of the RDL 36 and the second surface 27b of the dielectric layer 26 are substantially level with each other and coplanar. The top surface 62 of the RDL 38 and the top surface of the dielectric layer 37 are substantially level with each other and coplanar. In some other embodiments, the top surface 60 of the RDL 36 is slightly lower than the second surface 27b of the dielectric layer 26. The top surface 62 of the RDL 38 is slightly lower than the top surface of the dielectric layer 37.

Referring to FIG. 2H and FIG. 2I, the package structure 50a having the connectors 44 and the RDL structure 40 is turned over, the glue layer 11 is decomposed under the heat of light, and the carrier 10 is then released from the package structure 50a. In some embodiments, the package structure 50a may be further connected to other package structures. In some embodiments, after the carrier 10 is released, one or multiple openings 49 are formed in the dielectric layer 12 by a laser drilling process, for example. The opening 49 penetrates through the dielectric layer 12 and exposes a portion of the TIV 24. In some embodiments, the package structure 50a may further be electrically coupled to a package structure 70 to form a package-on-package (POP) device, but the disclosure is not limited thereto.

Referring to FIG. 2I, in some embodiments, the package structure 70 has a substrate 71, and a die 72 is mounted on one surface (e.g. top surface) of the substrate 71. Bonding wires 73 are used to provide electrical connections between the die 72 and pads 74 (such as bonding pads) on the same top surface of the substrate 71. TIVs (not shown) may be used to provide electrical connections between the pads 74 and pads 75 (such as bonding pads) on an opposing surface (e.g. bottom surface) of the substrate 71. Connectors 76 connect the pads 75 and fill in the openings 49 to electrically connect to the TIVs 24 of the package structure 50a. An encapsulant 77 is formed over the components to protect the components from the environment and external contaminants. In some embodiments, an underfill layer 78 is formed to fill the space between the package structure 50a and the package structure 70.

FIGS. 3A to 3K are schematic cross-sectional views of a method of forming a package structure according to the second embodiment of the disclosure. The present embodiment differs from the first embodiment in that the present embodiment further includes forming a mask layer 45 on a seed layer 34 after forming a seed layer 34 and before forming a conductive layer 135. Details are described as below.

Referring to FIGS. 3A to 3D, in accordance with the processes of the first embodiment of FIGS. 2A to 2D, a dielectric layer 26 is formed over the structure 30, and a trench 29 and a via hole 33 are formed in the dielectric layer 26, and thereafter, the seed layer 34 is formed on the dielectric layer 26. Each component in FIGS. 3A to 3D and the forming method thereof and its structural characteristics are substantially the same as those in the first embodiment, which will not be described again here.

Figure 3A:
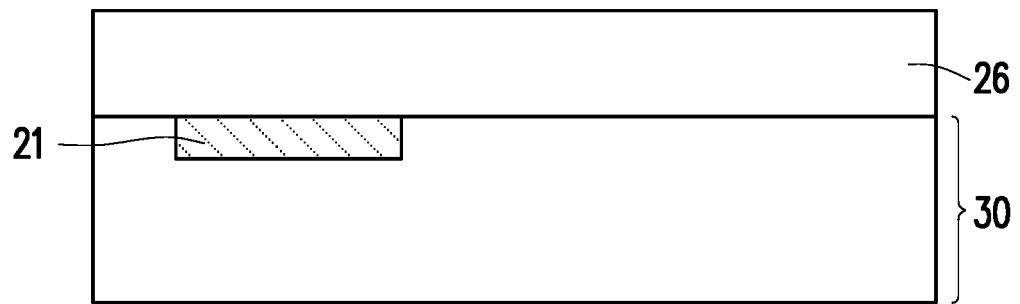
Figure 3B:
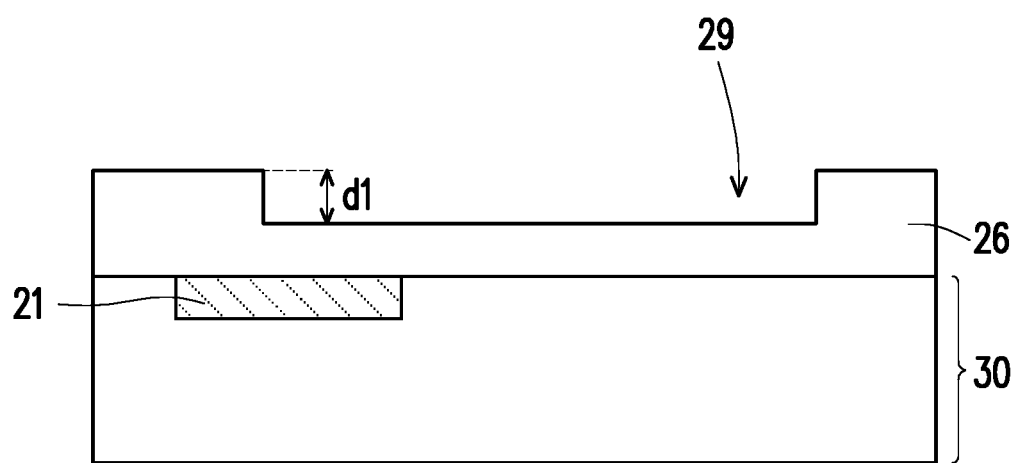
Figure 3C:
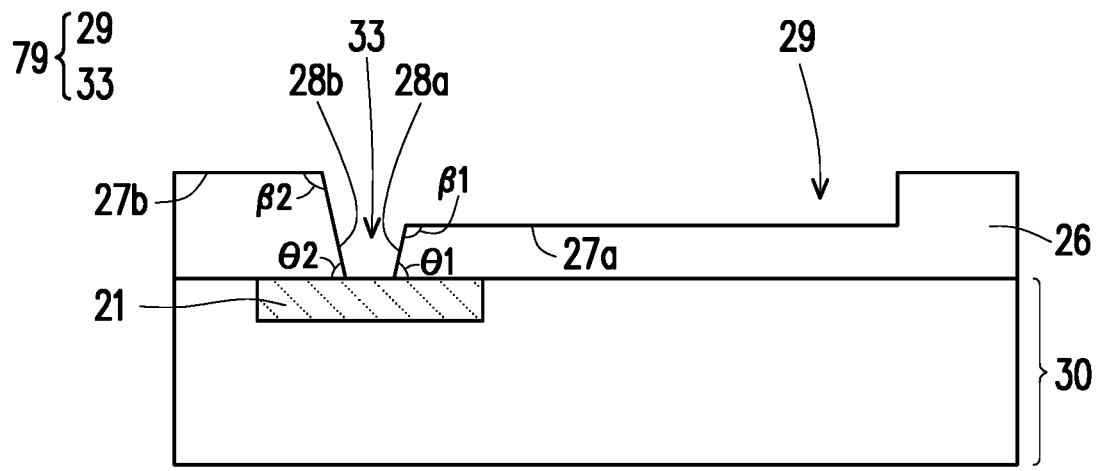
Figure 3D:
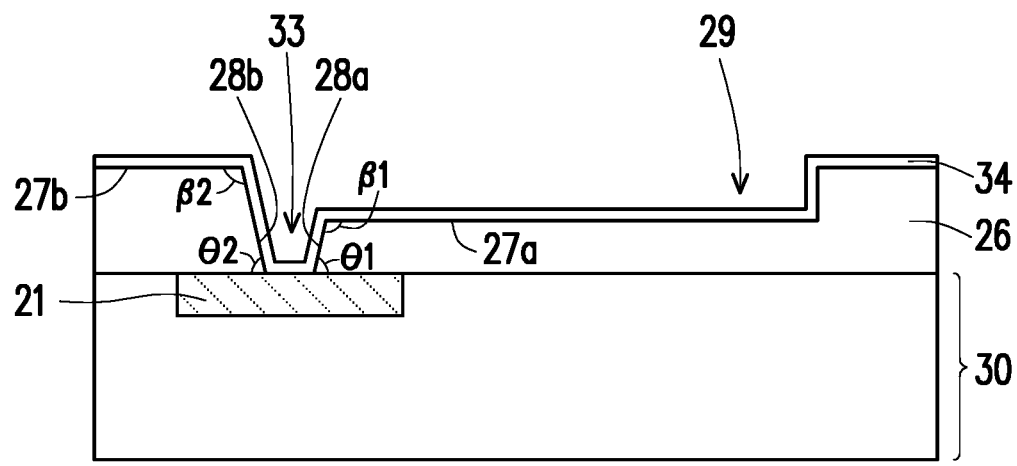
Figure 3E:
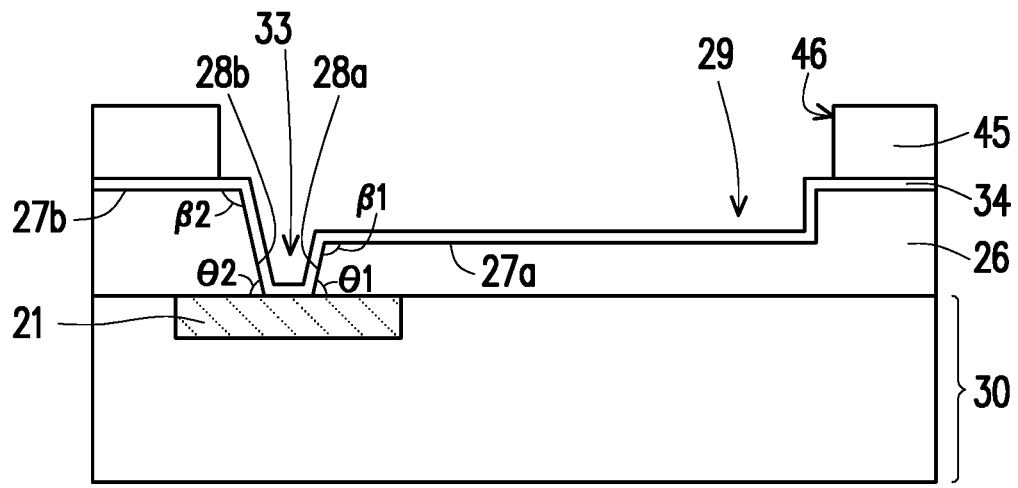

Referring to FIG. 3E, the mask layer 45 is formed on the seed layer 34. The mask layer 45 has an opening 46. In some embodiments, the opening 46 exposes the seed layer 34 disposed in the trench 29 and the via hole 33. In some other embodiments, the opening 46 exposes the seed layer 34 disposed in the trench 29 and the via hole 33 and the seed layer 34 disposed on the second surface 27b of the dielectric layer 26. The mask layer 45 is, for instance, a photoresist. The mask layer 45 is formed by, for instance, forming a photoresist layer on the seed layer 34 at first, and then an exposure and development process is performed.

Figure 3F:
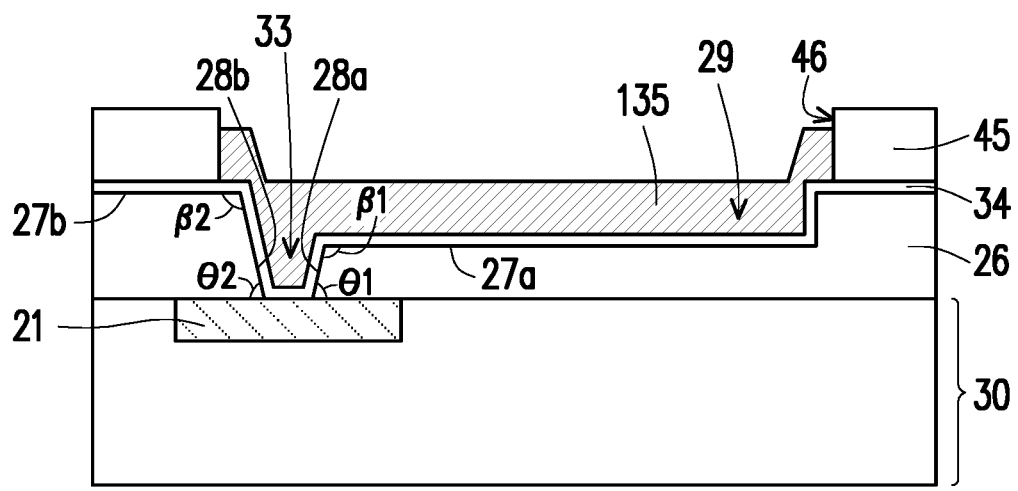
Figure 3G:
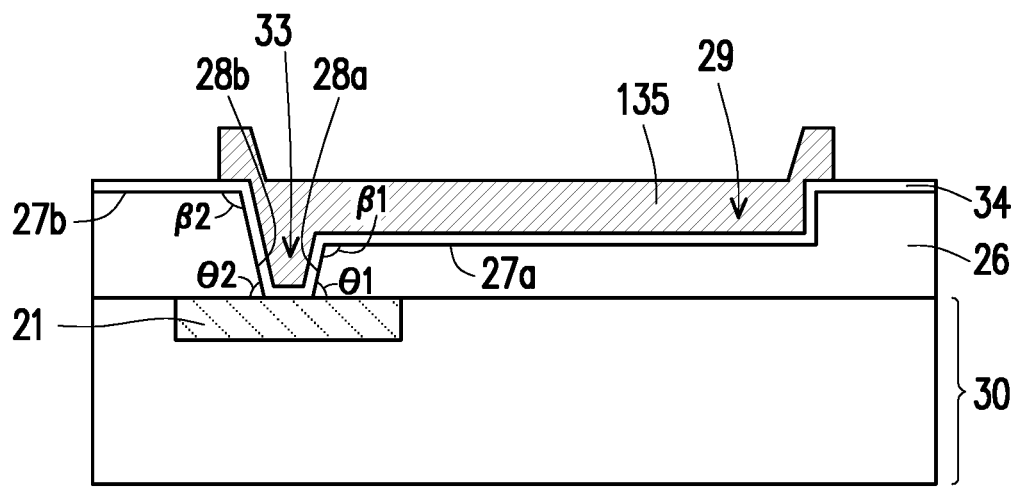

Referring to FIG. 3F and FIG. 3G, the conductive layer 135 is formed on the seed layer 34 exposed by the opening 46 by, for example, electroplating. The conductive layer 135 is filled in the trench 29 and the via hole 33 and covers the corner the seed layer 34. The conductive layer 135 is, for instance, copper or other suitable metals. Thereafter, the mask layer 45 is removed, such that the seed layer 34 located on the second surface 27b of the dielectric layer 26 and not covered by the conductive layer 135 is exposed.

Figure 3H:
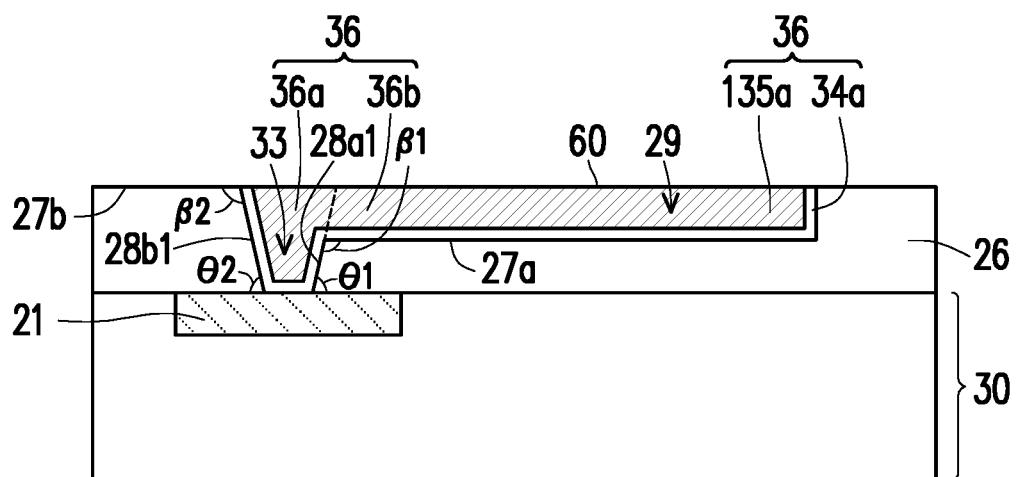
Figure 31:
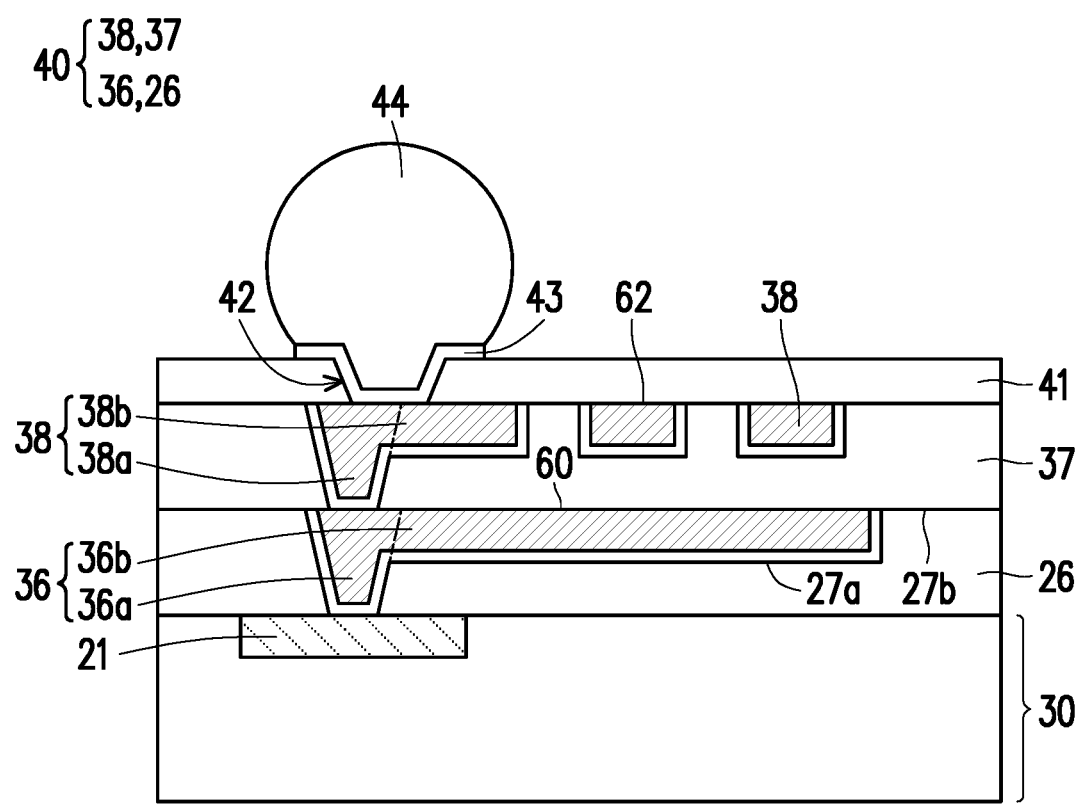

Referring to FIG. 3G and FIG. 3H, in some embodiments, the conductive layer 135 and the seed layer 34 disposed on the second surface 27b of the dielectric layer 26 are removed, such that the second surface 27b of the dielectric layer 26 is exposed, and a conductive layer 135a and a seed layer 34a remain in the trench 29 and the via hole 33. In some exemplary embodiments, the second surface 27b of the dielectric layer 26 is completely exposed. In some exemplary embodiments, the top surface of the conductive layer 135a, the top surface of the seed layer 34a, and the second surface 27b of the dielectric layer 26 are substantially level with each other and coplanar. The seed layer 34a surrounds sidewalls and bottoms of the conductive layer 135a, and is disposed between the conductive layer 135a and dielectric layer 26. The removal method includes a planarization process such as a chemical mechanical polishing (CMP) process, an etching process, or a combination thereof. In some embodiments, the removal process includes first removing the seed layer 34 not covered by the conductive layer 135 by an etching process with the conductive layer 135 as a mask, and then removing the conductive layer 135 and the seed layer 34 on the second surface 27b of the dielectric layer 26 by a planarization process such as a chemical mechanical polishing process. In some other embodiments, the conductive layer 135 and the seed layer 34 on the second surface 27b of the dielectric layer 26 are removed by a planarization process such as a chemical mechanical polishing process.

In this embodiment, since the conductive layer 135 only covers an extremely small portion of the second surface 27b of the dielectric layer 26 but does not completely cover the second surface 27b of the dielectric layer 26, the time and cost of the chemical mechanical polishing process for the conductive layer 135 may be reduced.

Referring to FIG. 3H, the conductive layer 135a and the seed layer 34a disposed in the via hole 33 form a via 36a. The conductive layer 135a and the seed layer 34a disposed in the trench 29 form a trace 36b. The via 36a and the trace 36b form an RDL 36 embedded in the dielectric layer 26. The structural characteristics of the RDL 36 and the dielectric layer 26 are the same as those of the first embodiment, which will not be described again here.

In some other embodiments, the seed layer 34 not covered by the conductive layer 135 is removed by an etching process with the conductive layer 135 as a mask, such that a portion of the second surface 27b of the dielectric layer 26 is exposed. The conductive layer 135 is not removed and remain over the other portion of the second surface 27b of the dielectric layer 26 and is filled in the trench 29 and the via hole 33 (not shown).

Figure 3J:
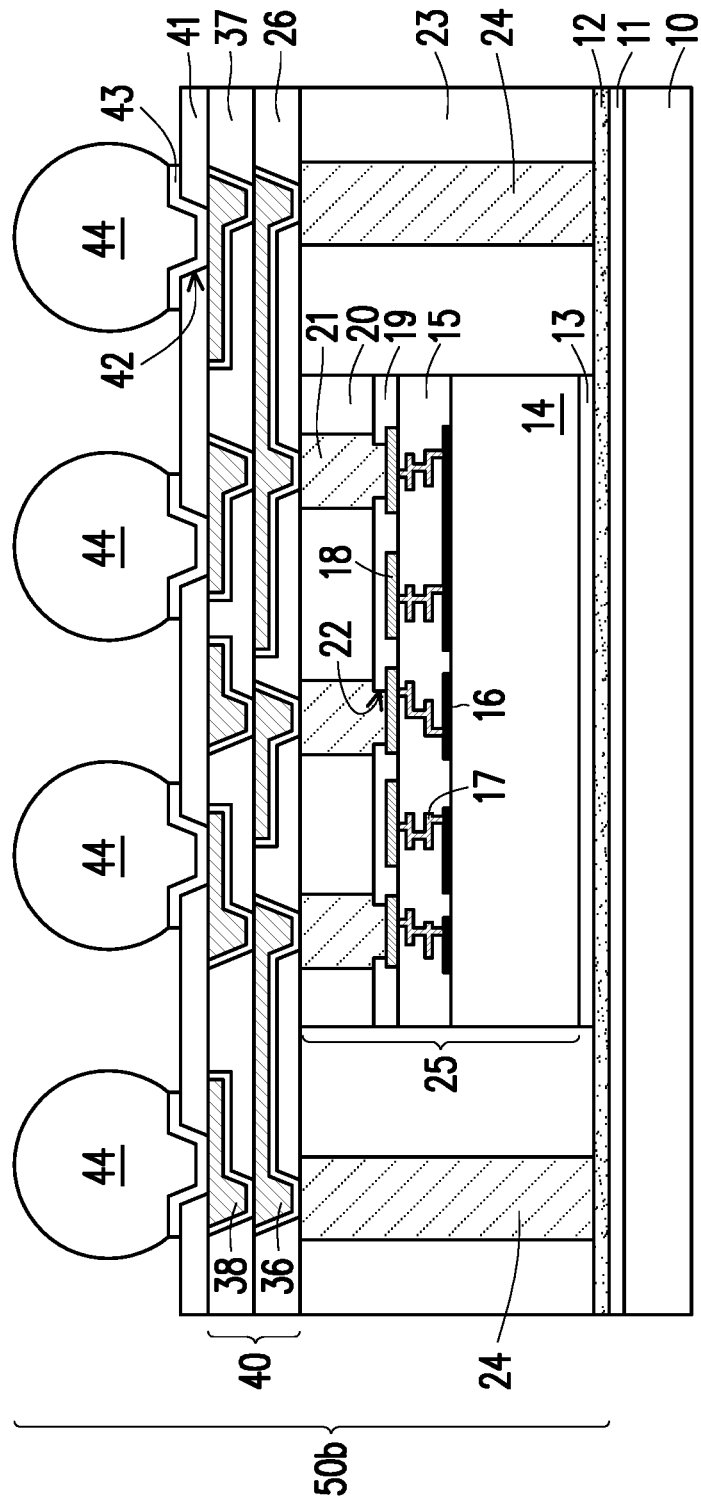

Referring to FIG. 3I and FIG. 3J, similar to the first embodiment, the process of FIG. 3A to FIG. 3H is repeated to form a dielectric layer 37 and an RDL 38 on the dielectric layer 26 and the RDL 36. In some embodiments, the dielectric layer 26, the RDL 36, the dielectric layer 37, and the RDL 38 form an RDL structure 40. Thereafter, in accordance with the same process as in the first embodiment, a passivation layer 41 is formed on the RDL structure 40, and a window 42 is formed in the passivation layer 41. Then, a conductive layer 43 and connectors 44 are formed. The connectors 44 are electrically connected to the connectors 21 through the conductive layer 43 and the RDL structure 40.

Referring to FIG. 3J, the package structure 50b of the second embodiment of the disclosure is thus completed, and the structural features of the package structure 50b of the present embodiment is substantially the same as those of the package structure 50a of the first embodiment, which will not be described again here.

Figure 3K:
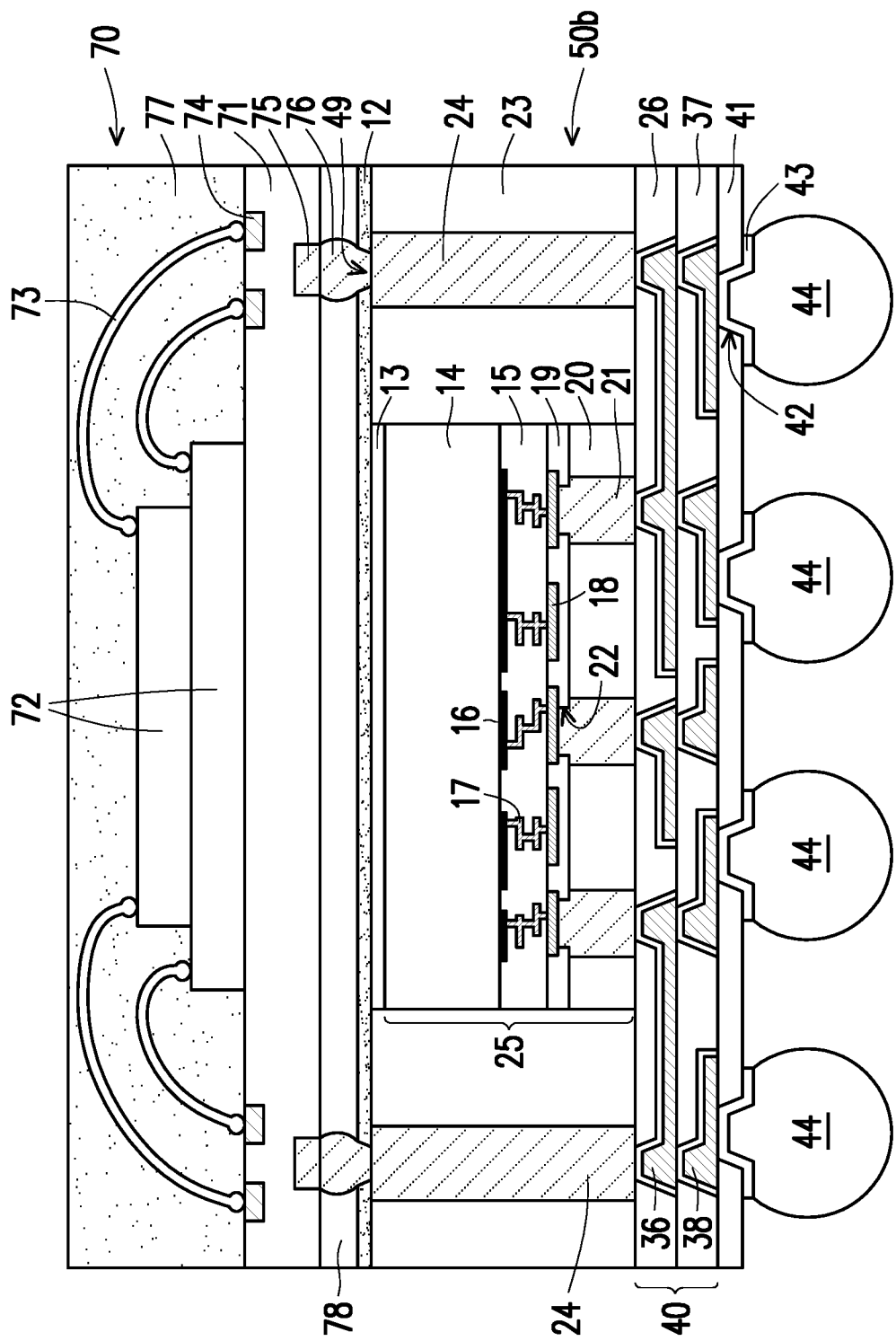

Referring to FIG. 3J and FIG. 3K, the glue layer 11 is decomposed and the carrier 10 is then released from the package structure 50b. In some embodiments, after the carrier 10 is released, one or multiple openings 49 are formed in the dielectric layer 12, the package structure 50b may be further connected to the package structure 70 through the connectors 76 so as to form a package-on-package (POP) device. In some embodiments, an underfill layer 78 is formed to fill the space between the package structure 50b and the package structure 70. The structural characteristics of the package structure 70 and the connecting method between the package structure 70 and the package structure 50b are similar to those of the first embodiment, which will not be described again here.

FIG. 4A to FIG. 4I are schematic cross-sectional views of a method of forming a package structure according to the third embodiment of the disclosure. The difference between the present embodiment and the first/second embodiment is that the dielectric layer 126 of the present embodiment has a two-layer structure, wherein a dielectric layer 126 includes a first dielectric material layer 126a and a second dielectric material layer 126b, which is different from the single layer structure of the dielectric layer 26 in the first and second embodiments. Details are described below.

Figure 4A:
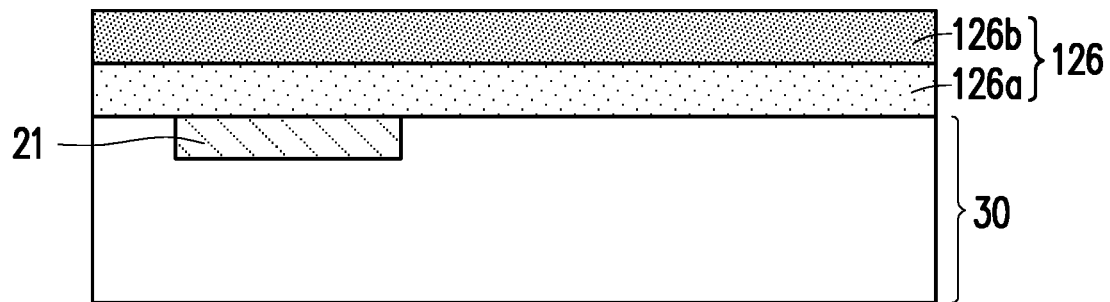

Referring to FIG. 4A, a dielectric layer 126 is formed on the structure 30. In other words, the dielectric layer 126 is formed on a die 25 and an encapsulant 23 shown in FIG. 1. The material and the forming method of the dielectric layer 126 are the same as those of the dielectric layer 26 in the first and second embodiments. The difference from the foregoing embodiments is that, the dielectric layer 126 is a two-layer structure including a first dielectric material layer 126a and a second dielectric material layer 126b sequentially formed on the structure 30. The material of the first dielectric material layer 126a is different from the material of the second dielectric material layer 126b. In some embodiments, the first dielectric material layer 126a and the second dielectric material layer 126b are respectively different organic dielectric materials. In some embodiments, the first dielectric material layer 126a and the second dielectric material layer 126b are polymer layers, respectively. In some exemplary embodiments, the first dielectric material layer 126a and the second dielectric material layer 126b are both photosensitive materials. In other exemplary embodiments, one of the first dielectric material layer 126a and the second dielectric material layer 126b is a positive photoresist, and the other of the first dielectric material layer 126a and the second dielectric material layer 126b is a negative photoresist. In other exemplary embodiments, the first dielectric material layer 126a and the second dielectric material layer 126b are photoresists (photosensitive materials) sensitive to different wavelengths. In some other exemplary embodiments, one of the first dielectric material layer 126a and the second dielectric material layer 126b is a photosensitive material, and the other of the first dielectric material layer 126a and the second dielectric material layer 126b is a non-photosensitive material. In some other alternative embodiments, the first dielectric material layer 126a and the second dielectric material layer 126b are different inorganic dielectric materials, respectively. In some embodiments, the thickness of the first dielectric material layer 126a and the second dielectric material layer 126b range from 1 μm to 3 μm, respectively. The thicknesses of the first dielectric material layer 126a and the second dielectric material layer 126b may be the same or different.

Figure 4B:
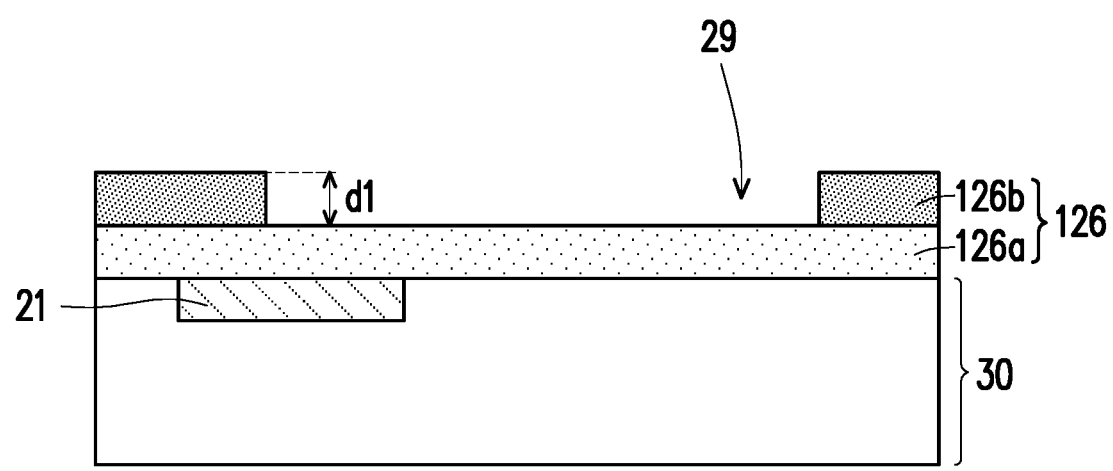

Referring to FIG. 4B, a portion of the second dielectric material layer 126b is removed with the first dielectric material layer 126a as a stop layer to form a trench 29 in the second dielectric material layer 126b, that is, the trench 29 is formed from the top surface of the dielectric layer 126. In some embodiments, the depth dl of the trench 29 is substantially the same as the thickness of the second dielectric material layer 126b. In other words, the trench 29 exposes a portion of the first dielectric material layer 126a. In some embodiments in which the second dielectric material layer 126b is a photosensitive polymer material, the removal method includes exposure and development processes or irradiation with a laser beam. In some other embodiments in which the second dielectric material layer 126b is an inorganic dielectric material or a non-photosensitive polymer material, the removal method includes lithography and etching processes or irradiation with a laser beam, and the first dielectric material layer 126a may be used as an stop layer. The lithography and etching processes include forming a patterned photoresist (not shown) on the second dielectric material layer 126b, and etching the second dielectric material layer 126b by using the patterned photoresist as a mask and using the first dielectric material layer 126a as an etching stop layer.

Figure 4C:
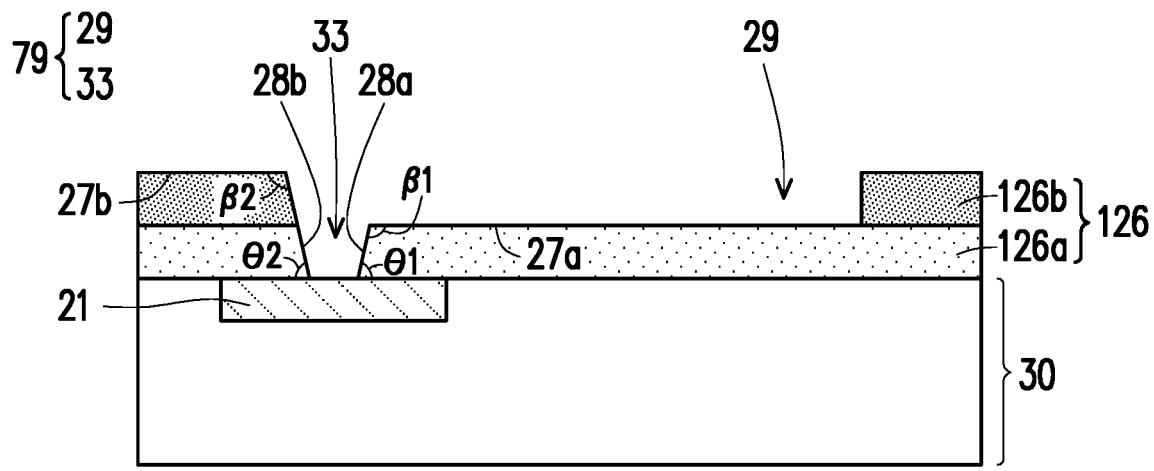

Referring to FIG. 4C, a portion of the second dielectric material layer 126b and a portion of the first dielectric material layer 126a are removed to form a via hole 33 in the dielectric layer 126. In some embodiments in which one of the first dielectric material layer 126a and the second dielectric material layer 126b is a positive photoresist, the other of the first dielectric material layer 126a and the second dielectric material layer 126b is a negative photoresist, or the first dielectric material layer 126a and the second dielectric material layer 126b are photosensitive materials sensitive to different wavelengths, and the removal method includes two exposure and development processes or irradiation with a laser beam in different process conditions. In the embodiments in which the second dielectric material layer 126b is a photosensitive material and the first dielectric material layer 126a is a non-photosensitive material, an etching process may be performed on the first dielectric material layer 126a after performing an exposure and development process to remove a portion of the second dielectric material layer 126b. Alternatively, a portion of the second dielectric material layer 126b and the first dielectric material layer 126a may be removed by irradiation with a laser beam. In embodiments in which the first dielectric material layer 126a and the second dielectric material layer 126b are respectively different inorganic dielectric materials, a photolithography process and an etching process may be performed on the second dielectric material layer 126b, and then another etching process is performed on the first dielectric material layer 126a. The via hole 33 penetrates through the second dielectric material layer 126b and the first dielectric material layer 126a of the dielectric layer 126 to expose a portion of the connectors 21 of the die 25. Furthermore, the via hole 33 is disposed at an end of the trench 29 and connected with the trench 29.

Still referring to FIG. 4C, the dielectric layer 126 with the trench 29 and the via hole 33 formed therein has a first surface 27a, a second surface 27b, a first sidewall 28a and a second sidewall 28b, and a first corner β1 and a second corner β2. The structural features of the via hole 33 and the trench 29 and the dielectric layer 126 are the same as those of the first or second embodiment. The difference is that the dielectric layer 126 is a two-layer structure. In other words, the first surface 27a is the bottom surface of the trench 29, which is the top surface of first dielectric material layer 126a. The second surface 27b is the top surface of the second dielectric material layer 126b. The first sidewall 28a and the second sidewall 28b are the two sidewalls of the via hole 33. The first sidewall 28a is formed by the first dielectric material layer 126a. The second sidewall 28b is formed by the first dielectric material layer 126a and the second dielectric material layer 126b. The first sidewall 28a of the dielectric layer 126 and the first surface 27a are connected and form the first corner β1. The second sidewall 28b of the dielectric layer 126 and the second surface 27b are connected and form the second corner β2. In other words, the first corner β1 of the dielectric layer 126 is a corner of the first dielectric material layer 126a. The second corner β2 of the dielectric layer 126 is a corner of the second dielectric material layer 126b.

Figure 4D:
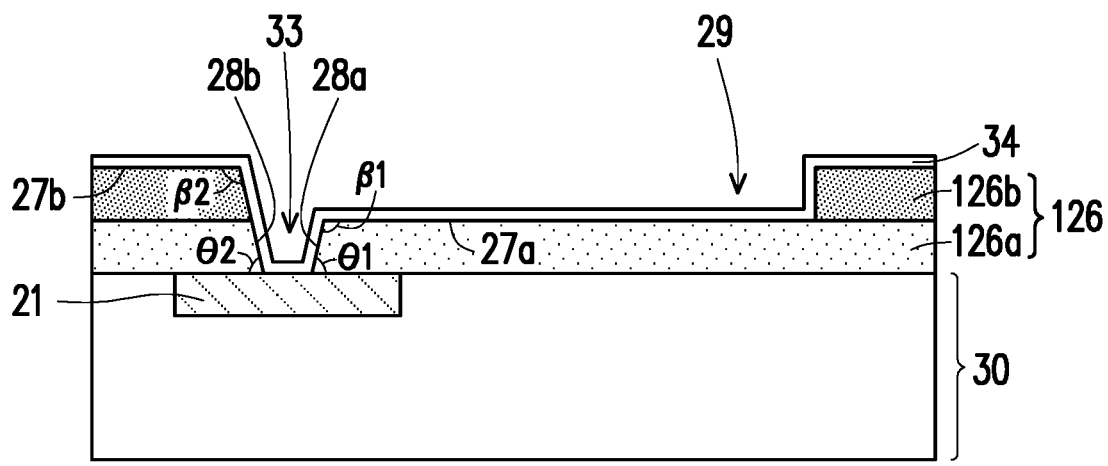
Figure 4E:
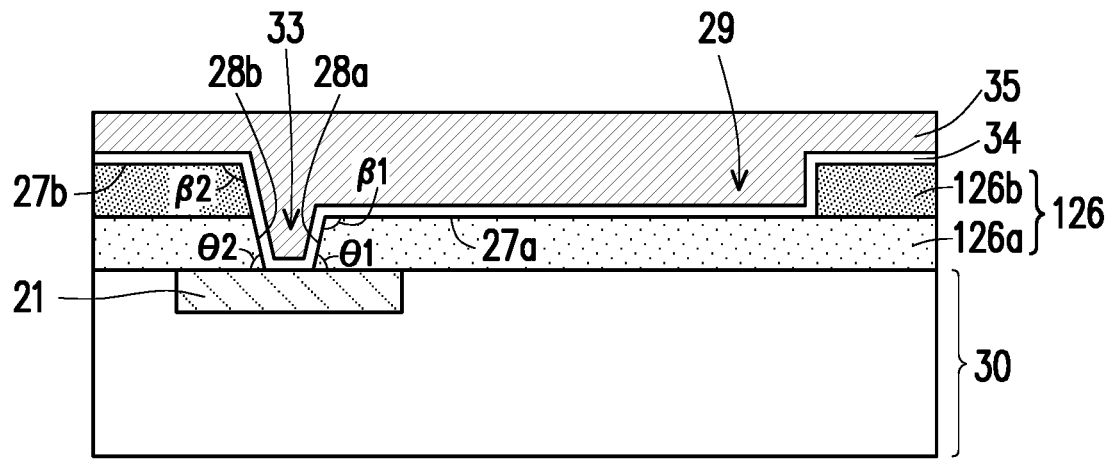
Figure 4F:
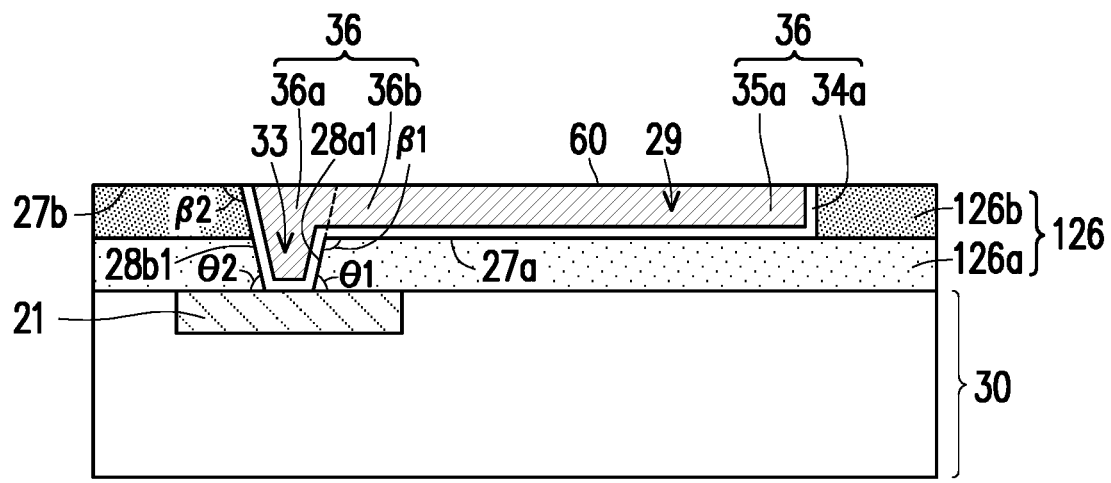

Referring to FIG. 4D to FIG. 4F, similar to the first embodiment, a seed layer 34 is formed on the dielectric layer 126. In some embodiments, the seed layer 34 is a conformal seed layer. Thereafter, a conductive layer 35 is formed on the seed layer 34. Next, the conductive layer 35 and the seed layer 34 on the second surface 27b of the dielectric layer 126 are removed, such that the second surface 27b of the dielectric layer 126 (that is, the top surface of the second dielectric material layer 126b) is exposed, and the conductive layer 35a and the seed layer 34a remain in the trench 29 and the via hole 33. In some embodiments, the second surface 27b of the dielectric layer 126 is completely exposed. In some embodiments, the top surfaces of the conductive layer 35a and the seed layer 34a and the second surface 27b of the dielectric layer 126 (that is, the top surface of the second dielectric material layer 126b) are substantially level with each other and coplanar. The seed layer 34a surrounds sidewalls and bottoms of the conductive layer 35a, and is disposed between the conductive layer 35a and dielectric layer 126.

Referring to FIG. 4F, similar to the foregoing embodiments, the conductive layer 35a and the seed layer 34a form an RDL 36. The RDL 36 includes a via 36a and a trace 36b. The structural characteristics of the RDL 36 and the dielectric layer 126 are the same as those of the foregoing embodiments, which will not be described again here.

Figure 4G:
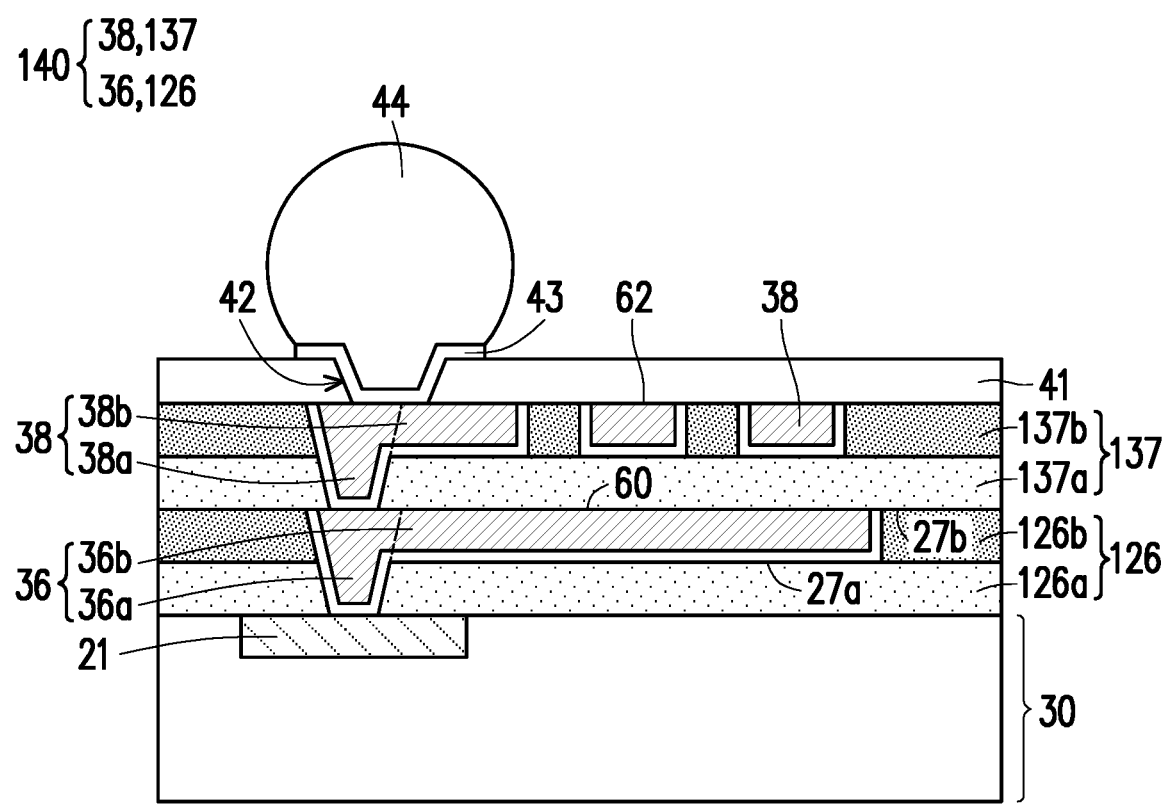

Referring to FIG. 4G, in some embodiments, the process of FIG. 4A to FIG. 4F may be repeated to form a dielectric layer 137 and an RDL 38 on the dielectric layer 126 and the RDL 36. In some embodiments, the dielectric layer 137 may include a two-layer structure, such as a first dielectric material layer 137a and a second dielectric material layer 137b. The dielectric layer 126, the RDL 36, the dielectric layer 137, and the RDL 38 form an RDL structure 140.

Referring to FIG. 4G, a passivation layer 41 is formed on the RDL structure 140 and a window 42 is formed in the passivation layer 41. Next, a conductive layer 43 and connectors 44 are formed. The connectors 44 are electrically connected to the connectors 21 through the conductive layer 43 and the RDL structure 140.

Figure 4H:
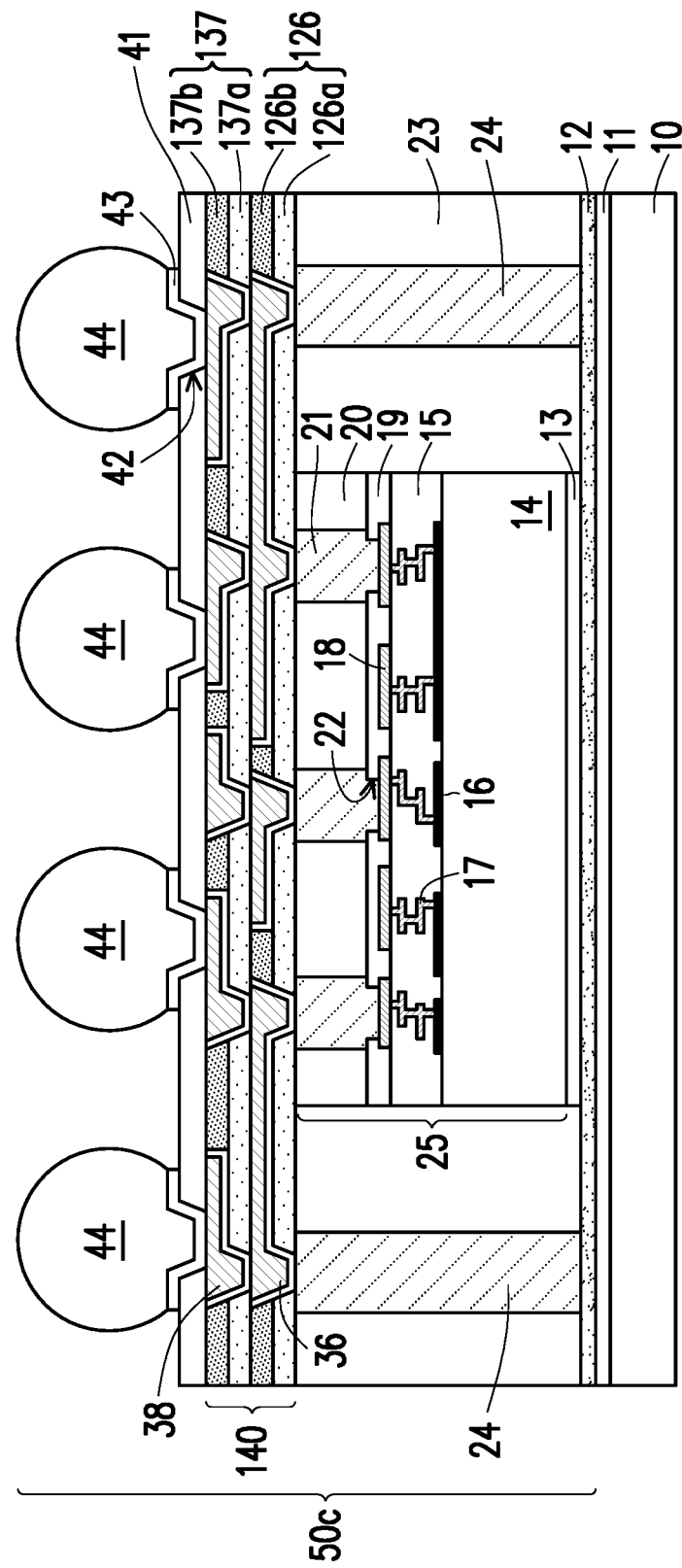
Figure 41:
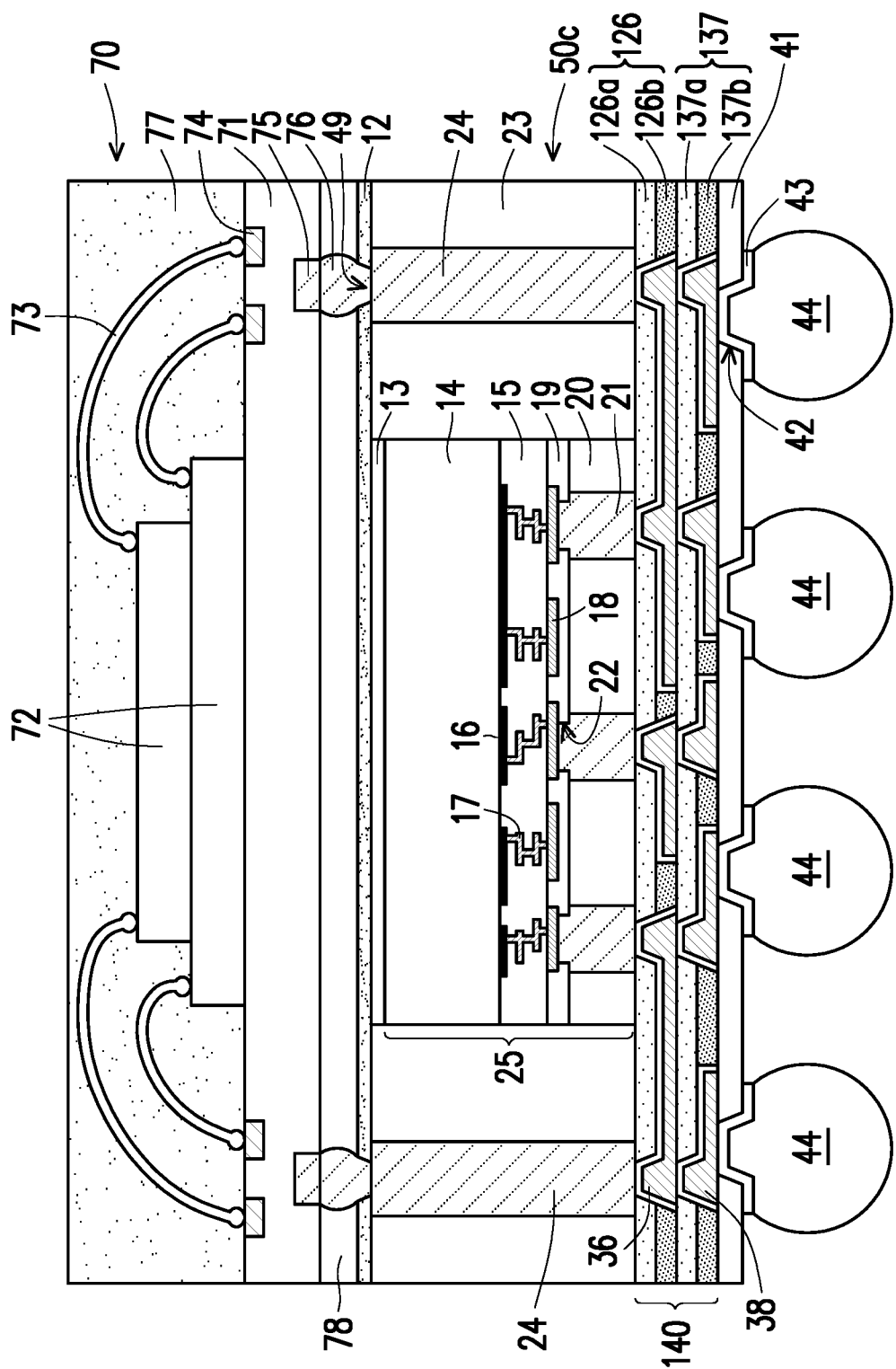

Referring to FIG. 4H, the package structure 50c of the third embodiment of the disclosure is thus completed, and the dielectric layer 126 and the dielectric layer 137 of the package structure 50c are two-layer structures, respectively. Except for the dielectric layer 126 and the dielectric layer 137, the structural features of the package structure 50c of the present embodiment are the same as those of the package structure 50a/50b of the foregoing embodiments, which will not be described here.

Referring to FIG. 4H and FIG. 4I, the glue layer 11 is decomposed and the carrier 10 is then released from the package structure 50c. In some embodiments, after the carrier 10 is released, one or multiple openings 49 are formed in the dielectric layer 12, the package structure 50c may be further connected to the package structure 70 through the connectors 76 so as to form a package-on-package (POP) device. In some embodiments, an underfill layer 78 is formed to fill the space between the package structure 50c and the package structure 70.

In this embodiment, as the dielectric layer 126 is a two-layer structure, and the material of the first dielectric material layer 126a and the second dielectric material layer 126b are different, the first dielectric material layer 126a can be used as a stop layer when the trench 29 is formed, therefore, the bottom surface of the trench 29, that is, the first surface 27a can be relatively more flat.

FIGS. 5A to 5K are schematic cross-sectional views of the forming process of the package structure according to the forth embodiment of the disclosure. This embodiment is similar to the third embodiment. The present embodiment differs from the third embodiment in that the present embodiment further includes forming a mask layer 45 on a seed layer 34 after forming the seed layer 34 and before forming a conductive layer 135. Details are described below.

The process of FIGS. 5A to 5D may be performed in accordance with the process of FIGS. 4A to 4D in the third embodiment. The structural features of the components formed in each process may be the same as those of the third embodiment. A dielectric layer 126 is formed on the structure 30. The dielectric layer 126 includes a first dielectric material layer 126a and a second dielectric material layer 126b. A trench 29 and a via hole 33 are then formed in the dielectric layer 126. Thereafter, a seed layer 34 is formed on the dielectric layer 126.

Figure 5A:
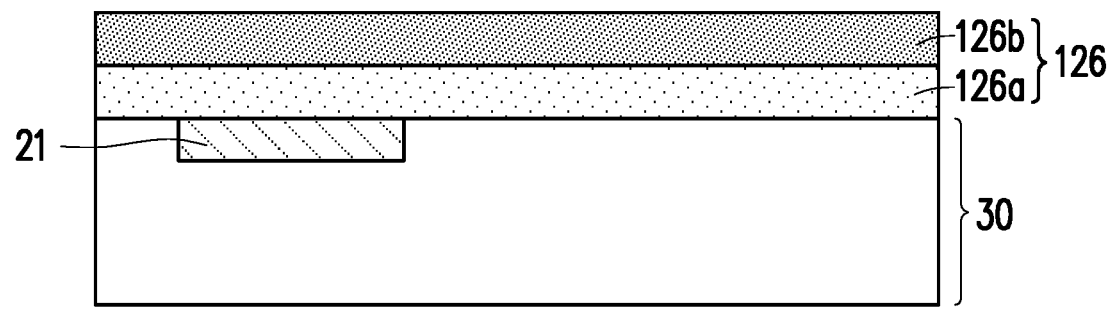
FIG. 5A to FIG. 5K are schematic cross-sectional views illustrating a method of forming a package structure according to a fourth embodiment of the disclosure.
Figure 5B:
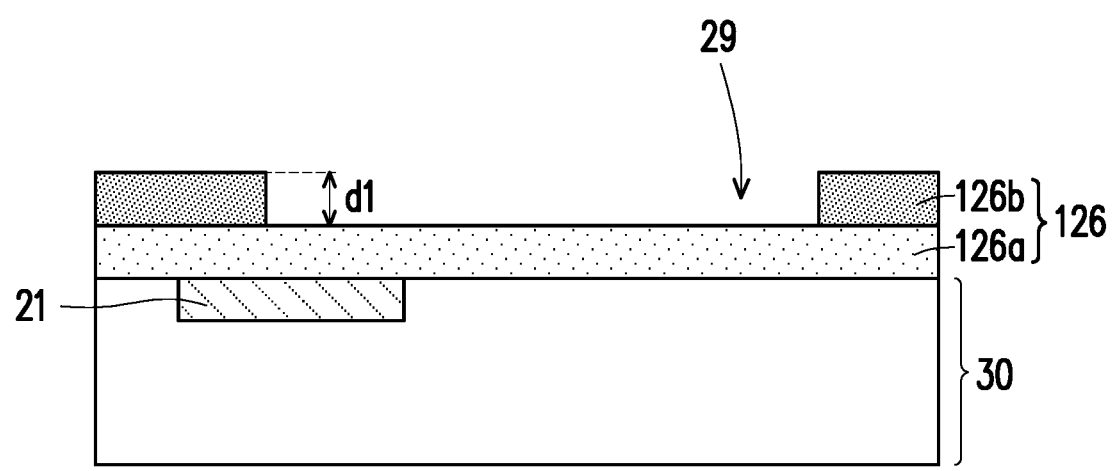
Figure 5C:
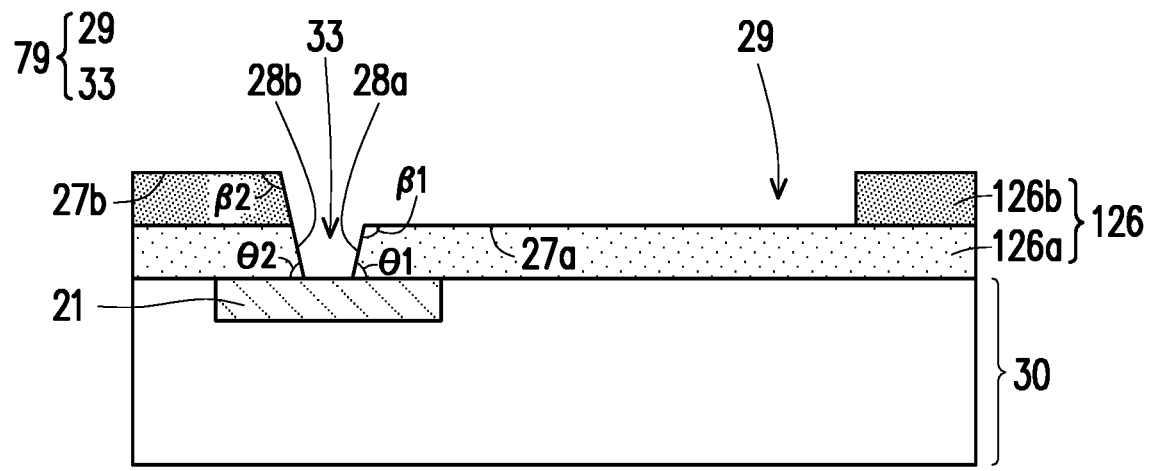
Figure 5D:
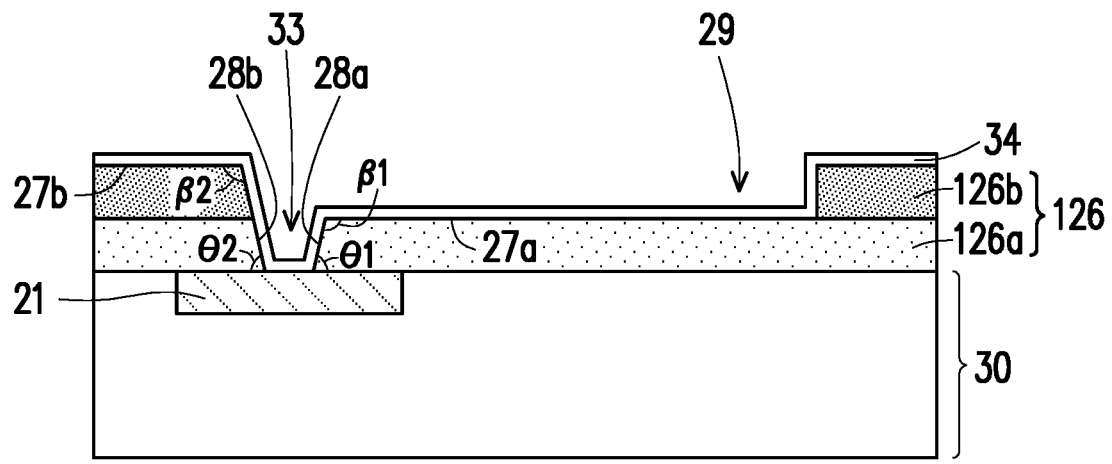
Figure 5E:
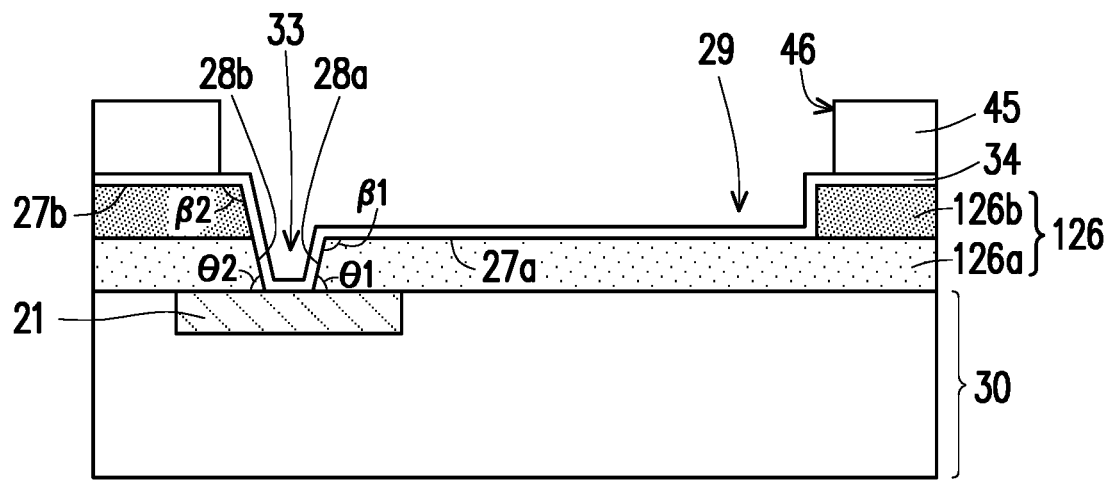
Figure 5F:
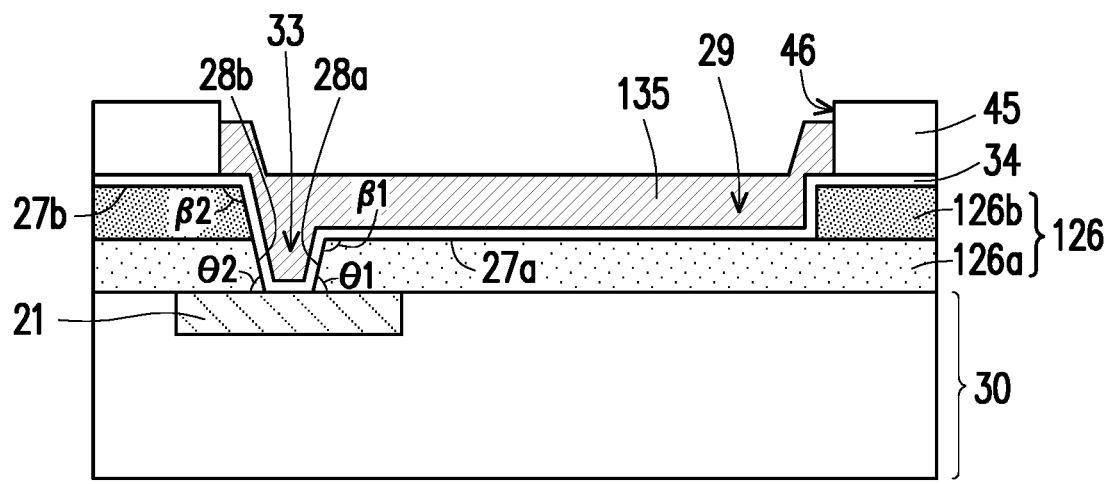

Referring to FIG. 5E and FIG. 5F, the process is the same as that of the second embodiment and is performed to form a mask layer 45 on the seed layer 34. The mask layer 45 has an opening 46.

Figure 5G:
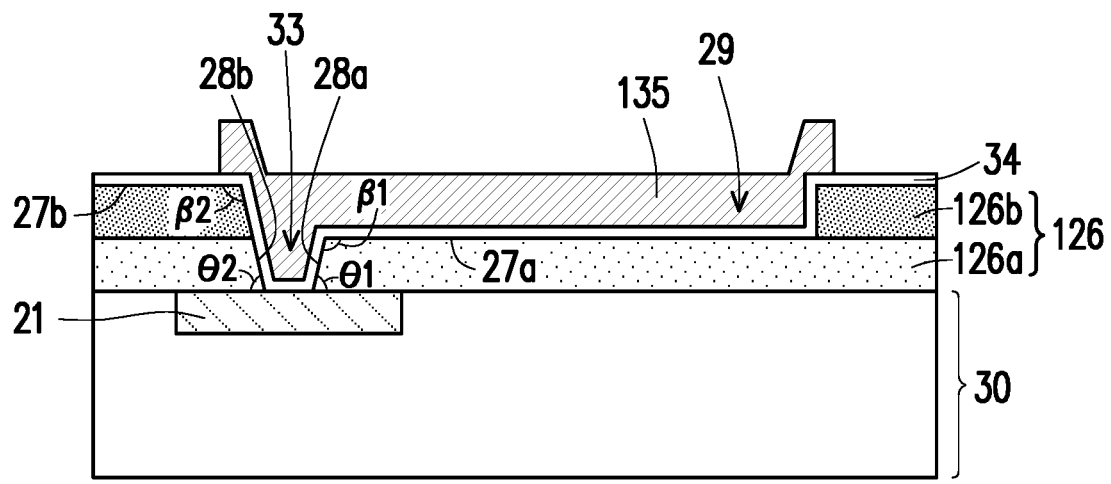

Referring to FIG. 5F and FIG. 5G, a conductive layer 135 is formed on the seed layer 34 exposed by the opening 46 of the mask layer 45. Thereafter, the mask layer 45 is removed, such that the seed layer 34 not covered by the conductive layer 135 is exposed.

Figure 5H:
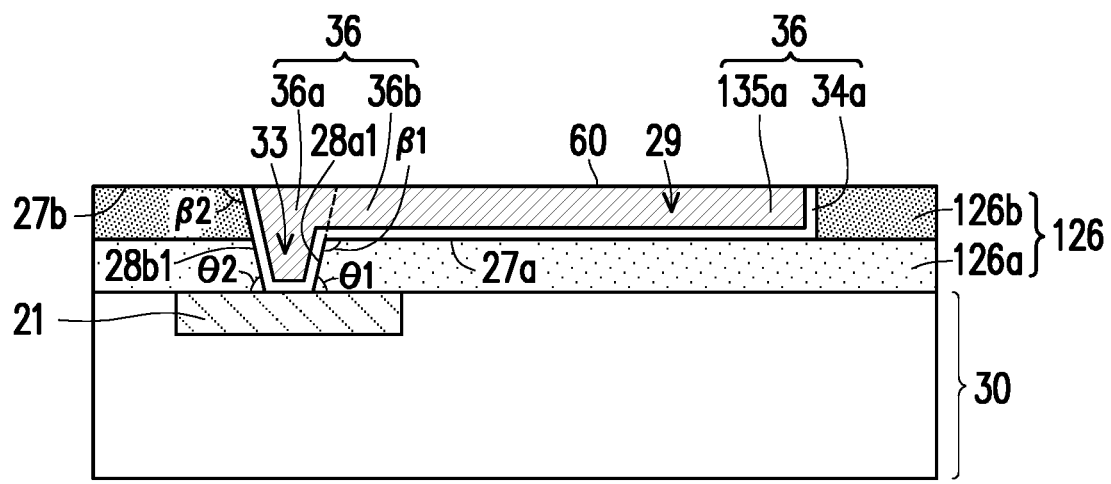

Referring to FIG. 5G and FIG. 5H, in some embodiments, the conductive layer 135 and the seed layer 34 on the second surface 27b of the dielectric layer 126 (that is, the top surface of the second dielectric material layer 126b) are removed, such that the second surface 27b of the dielectric layer 126 (that is, the top surface of the second dielectric material layer 126b) is exposed, and the conductive layer 135a and the seed layer 34a remain in the trench 29 and the via hole 33. In some embodiments, the second surface 27b of the dielectric layer 126 is completely exposed. In some embodiments, the top surface of the conductive layer 135a and the seed layer 34a and the second surface 27b of the dielectric layer 126 are substantially level with each other and coplanar.

Referring to FIG. 5H, the conductive layer 135a and the seed layer 34a form an RDL 36 embedded in the dielectric layer 126. The seed layer 34a surrounds sidewalls and bottoms of the conductive layer 135a, and is disposed between the conductive layer 135a and dielectric layer 126. The RDL 36 includes the via 36a and the trace 36b. The structural characteristics of the RDL 36 and the dielectric layer 126 are the same as those of the foregoing embodiments.

In some other embodiments, the seed layer 34 not covered by the conductive layer 135 is removed by an etching process with the conductive layer 135 as a mask, such that a portion of the second surface 27b of the dielectric layer 126 is exposed. The conductive layer 135 is not removed and remain over the other portion of the second surface 27b of the dielectric layer 126 and is filled in the trench 29 and the via hole 33 (not shown).

Figure 5I:
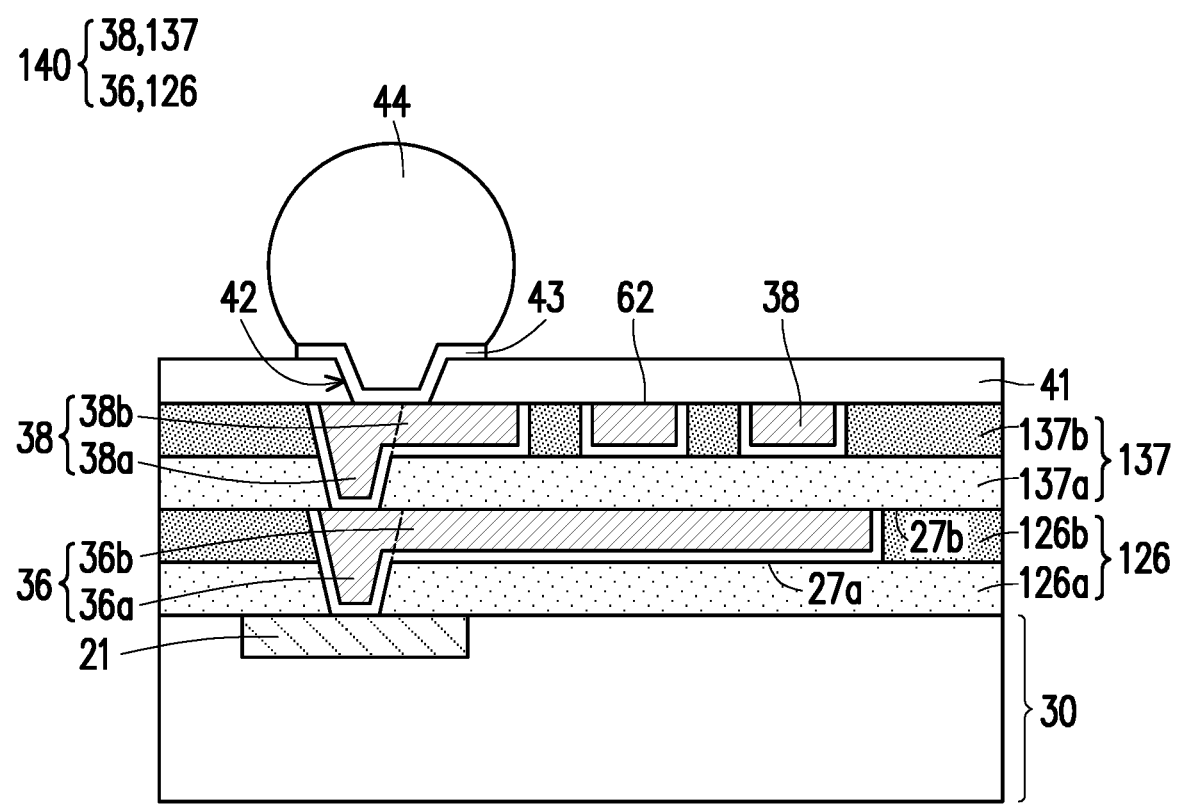

Referring to FIG. 5I, the process of FIG. 5A to FIG. 5H is repeated to form a dielectric layer 137 and an RDL 38 on the dielectric layer 126 and the RDL 36. The dielectric layer 137 includes a first dielectric material layer 137a and a second dielectric material layer 137b. The dielectric layer 126, the RDL 36, the dielectric layer 137, and the RDL 38 together form the RDL structure 140.

Figure 5J:
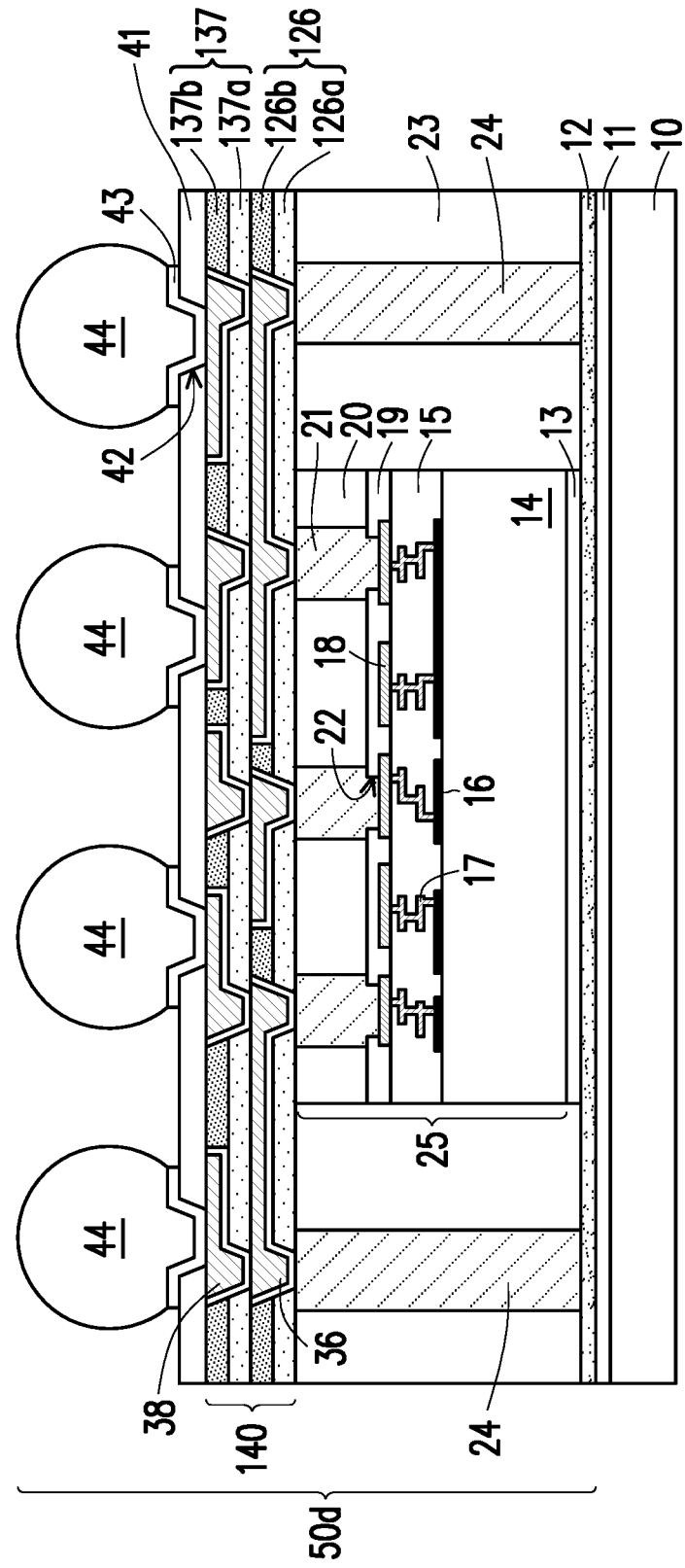

Referring to FIG. 5J, a passivation layer 41 is formed on the RDL structure 140, and a window 42 is formed in the passivation layer 41. Next, a conductive layer 43 and connectors 44 are formed. The connectors 44 are electrically connected to the connectors 21 through the conductive layer 43 and the RDL structure 140.

Referring to FIG. 5J, the package structure 50d of the fourth embodiment of the disclosure is thus completed, and the structural features of the package structure 50d are substantially the same as those of the package structure 50c of the third embodiment, which will not be described here.

Figure 5K:
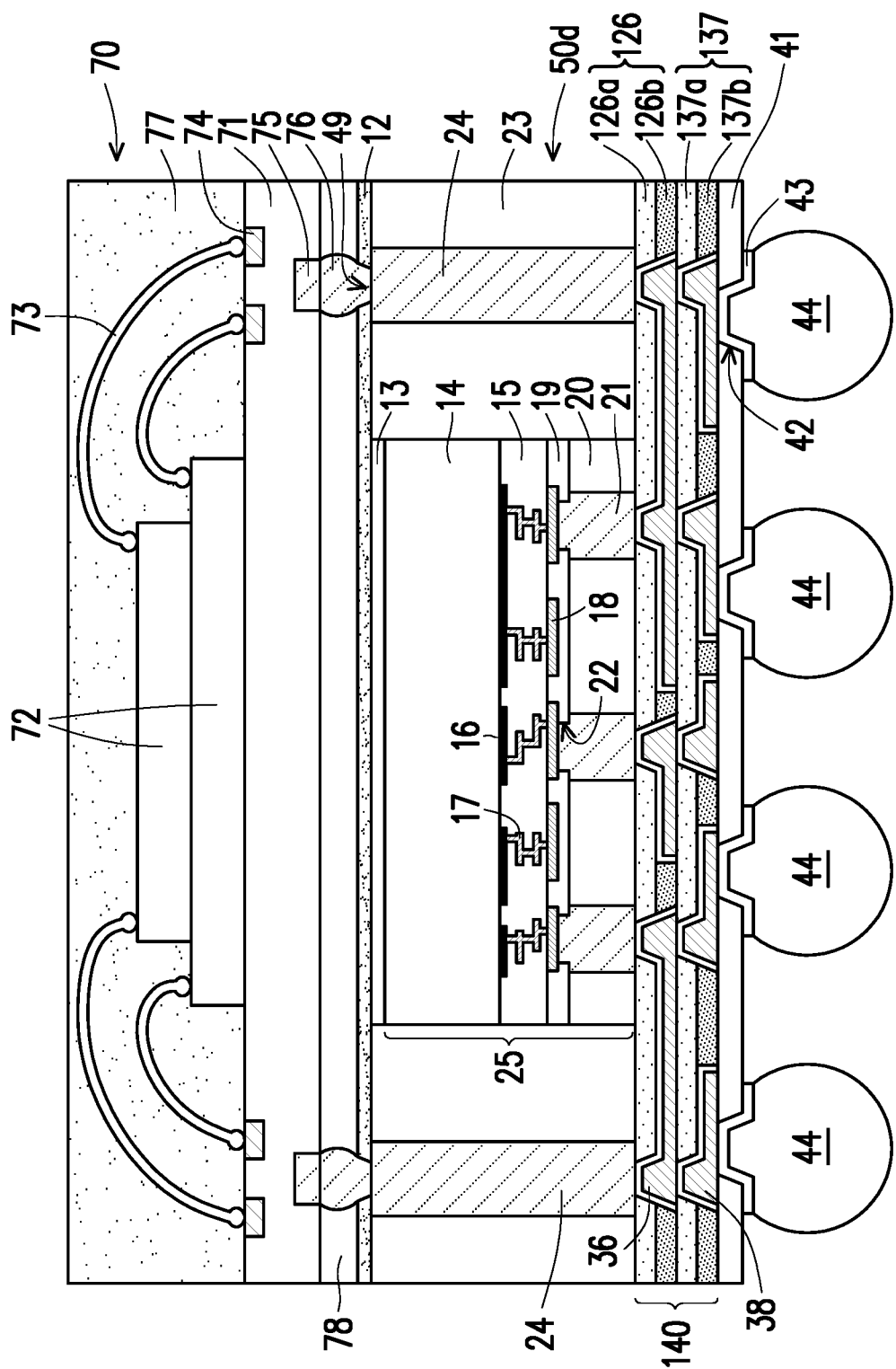

Referring to FIG. 5J and FIG. 5K, the glue layer 11 is decomposed, and the carrier 10 is then released from the package structure 50d. In some embodiments, after the carrier 10 is released, one or multiple openings 49 are formed in the dielectric layer 12, the package structure 50d may be further connected to the package structure 70 through the connectors 76 so as to form a package-on-package (POP) device. In some embodiments, an underfill layer 78 is formed to fill the space between the package structure 50d and the package structure 70.

In the first and second embodiments described above, the dielectric layer 37 is a single layer structure. In other embodiments, the dielectric layer 37 may be a double layer or a multilayer structure, such as the dielectric layer 137 in the third and fourth embodiments. Similarly, in the third and fourth embodiments above, the dielectric layer 137 is a two-layer structure, and in other embodiments, the dielectric layer 137 may be a single layer structure that is the same as the dielectric layer 37 in the first and second embodiments.

Figure 6:
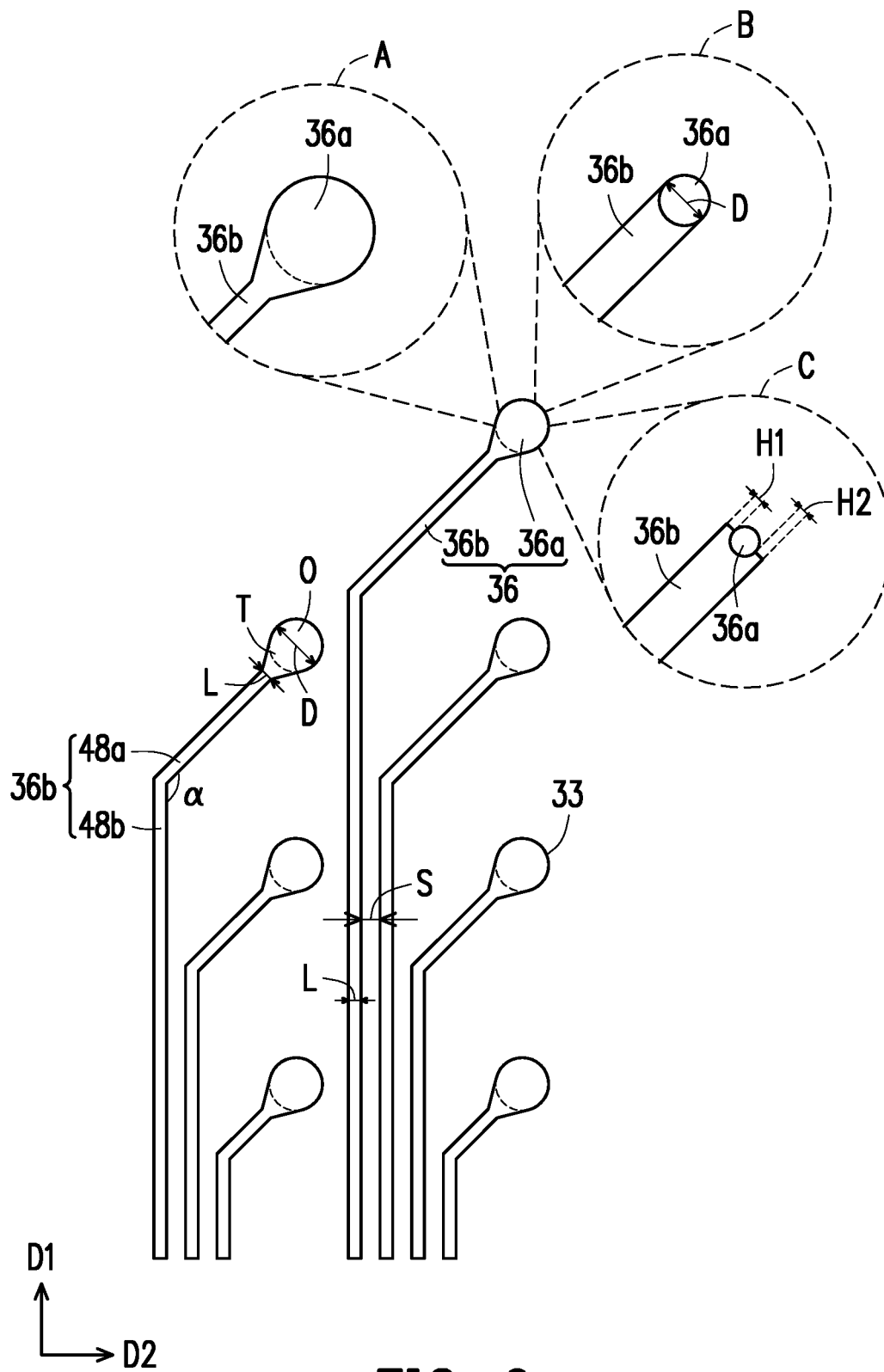
FIG. 6 is a top view of the RDL structure of the package structure according to some embodiments of disclosure.

FIG. 6 is a top view of the RDL structure 40/140 of the package structure of the disclosure. For the sake of brevity, only the RDL 36 of the RDL structure 40/140 is shown in the drawing.

Referring to FIG. 6, the RDL 36 includes a plurality of vias 36a and a plurality of traces 36b. The top surfaces of the vias 36a and the traces 36b form the top surface 60 of the RDL 36. In some embodiments, the area of the via 36a is the same as the area of the via hole 33. In some embodiments, the via 36a is not protruded from the via hole 33. In some embodiments, the via 36a is disposed at an end of the trace 36b and is in contact and electrically connected with the trace 36b. In some embodiments, the cross-section shape of the via 36a is circular, oval, rectangular, square, polygonal, or a combination thereof when viewed from the top. The trace 36b includes a tortuous line or a straight line. In some embodiments in which the via 36a is circular, the end of the RDL 36 is tear drop shaped, and includes a first part O and a second part T connected to each other. The first part O is a semicircle part, for example. The second part T is an Erlenmeyer flask shaped part or a triangle part, for example. The second part T is connected to the trace 36b. In some embodiments, the bottom width of the second portion T substantially equals to the diameter D of the first part O, that is, the diameter D of the via 36a. The top width of the second part T substantially equals to the width L of the trace 36b. In some embodiments in which the via 36a is circular, the diameter D of the via 36a is ranged from 10 μm to 15 μm. The width L of the trace 36b is ranged from 2 μm to 15 μm. The diameter D of the via 36a may be greater than, equal to, or less than the width L of the trace 36b (as shown in the enlarged drawings A, B, and C in FIG. 6). The ratio of the diameter D of the via 36a to the width L of the line 36b is ranged from 0.6 to 10, for example. In some exemplary embodiments in which the diameter D of the via 36a is less than the width L of the trace 36b, the width L of the trace 36b is, for example, 5 μm, and the diameter D of the via 36a is, for example, between 3 μm and 5 μm. In some exemplary embodiments in which the diameter D of the via 36a is less than the width L of the trace 36b, the distances H1 and H2 between the edge of the via 36a and the edge of the trace 36b is, for instance, 1 μm, but the disclosure is not limited thereto, the distance H1 and H2 may be the same or different. In alternatively exemplary embodiments in which the diameter D of the via 36a is larger than the width L of the trace 36b, the width L of the trace 36b is, for example, 2 μm or 5 μm, and the diameter D of the via 36a is, for example, between 10 μm and 15 μm. In some embodiments, the width L of the trace and the spacing S between the two traces are, for instance, 2 μm and 2 μm, or 5 μm and 5 μm.

Still referring to FIG. 6, in some embodiments, the vias 36a are arranged in a plurality of columns in a first direction D1 and are arranged in a plurality of rows in a second direction D2. That is, the vias 36a are orderly arranged in an array. However, the disclosure is not limited thereto, and the vias 36a may be randomly arranged. In some embodiments, the trace 36b is tortuous and disposed between two adjacent columns of the vias 36a in the second direction D2. In some embodiments, the trace 36b includes a first trace segment 48a and a second trace segment 48b connected to each other. The first trace segment 48a is connected to the via 36a. The second trace segment 48b is extended along the first direction D1 or the reverse direction of the first direction D1. The second trace segment 48b has an angle α with the first trace segment 48a. In some embodiments, the angle α may be an obtuse angle, or an acute angle.

The plurality of second trace segments 48b of the plurality of traces 36b is located between the two adjacent columns of the vias 36a.

Figure 8:
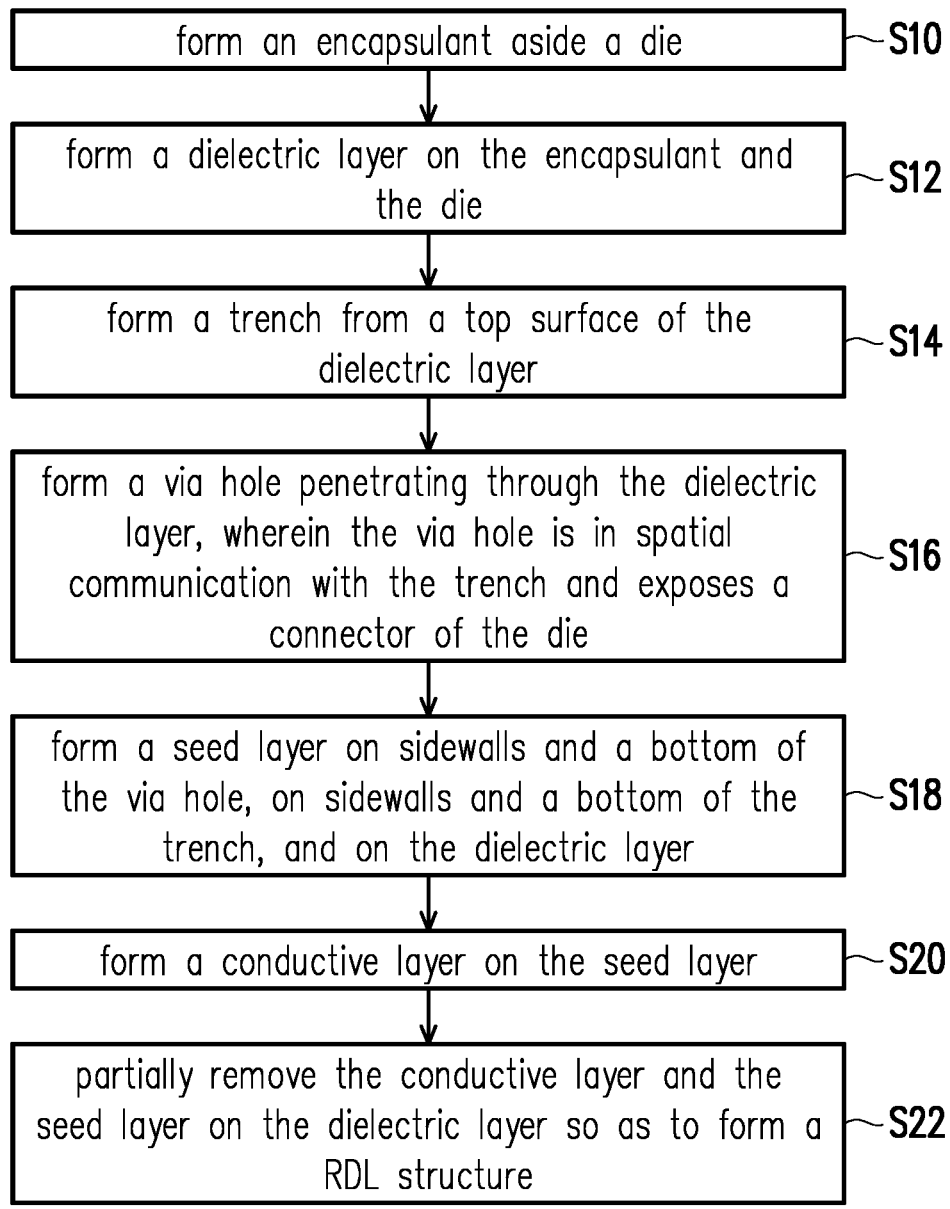
FIG. 8 is a flowchart of a method of forming a package structure according to some embodiments of the present disclosure.

FIG. 8 is a flowchart of a method of forming a package structure according to some embodiments of the disclosure. Referring to FIG. 8, FIG. 1, and FIG. 2A to FIG. 5J, first, in step S10, an encapsulant 23 is formed aside a die 25. Next, in step S12, a dielectric layer 26/126 is formed on the encapsulant 23 and the die 25. The dielectric layer 26/126 may be a single layer structure or a multilayer structure. In some embodiments, the dielectric layer 26 is a single layer structure. In some other embodiments, the dielectric layer 126 is a two-layer structure including a first dielectric material layer 126a and a second dielectric material layer 126b. In step S14, a trench 29 is formed in the upper portion of the dielectric layer 26/126. In step S16, a via hole 33 is formed through the dielectric layer 26/126. The via hole 33 is in spatial communication with the trench 29 and exposes the connectors 21 of the die 25. Next, in step S18, a seed layer 34 is formed on sidewalls and a bottom of the via hole 33, on sidewalls and a bottom of the trench 29, and on the dielectric layer 26/126 and in the trench 29 and the via hole 33. Thereafter, in step S20, a conductive layer 35/135 is formed on the seed layer 34. In some embodiments, a mask layer 45 with an opening 46 is further formed on the seed layer 34 between step S18 and step S20, that is, before the conductive layer 135 is formed on the seed layer 34. Thereafter, in step S20, a conductive layer 135 is formed on the seed layer 34 exposed by the opening 46 of the mask layer 45, and then the mask layer 45 is removed. Next, in step S22, the conductive layer 35/135 and the seed layer 34 on the dielectric layer 26/126 are removed. A conductive layer 35a/135a and a seed layer 34a remains in the trench 29 and the via hole 33 to form an RDL 36. The RDL 36 and the dielectric layer 26/126 form an RDL structure 40/140.

Figure 9:
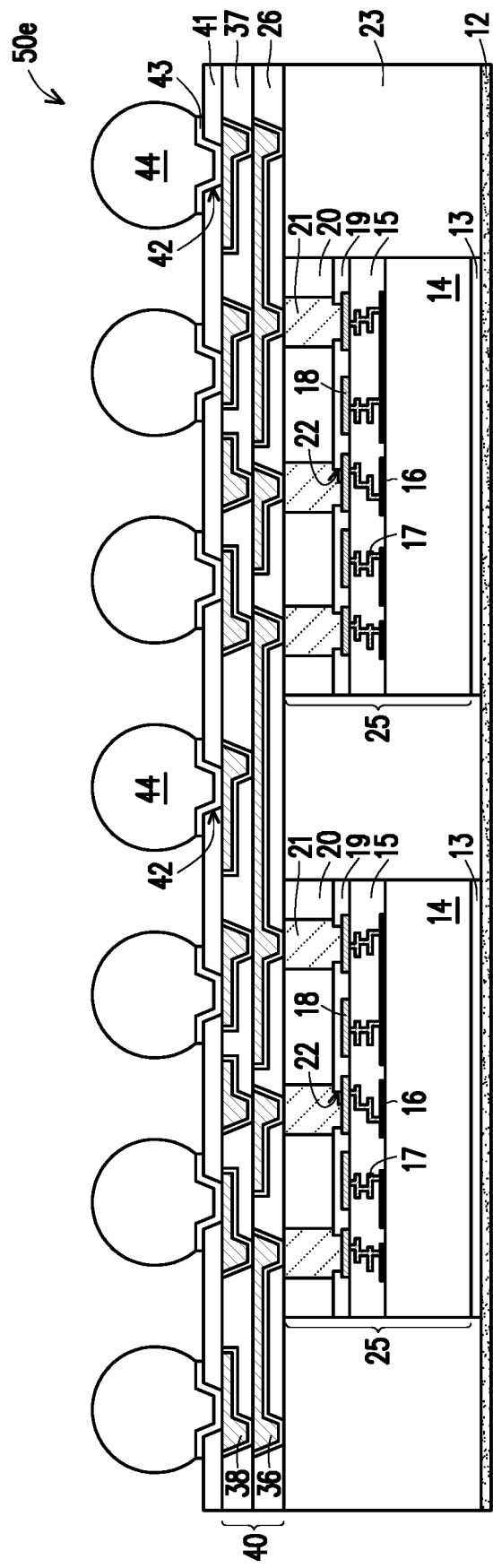
FIG. 9 is a schematic cross-sectional view illustrating an example of a package structure comprising two dies side by side according to some embodiments of the disclosure.

FIG. 9 is a schematic cross-sectional view illustrating a package structure 50e according to some embodiments of the disclosure. The package structure 50e differs from the package structures 50a/50b/50c/50d in that the package structure 50e comprises two dies 25 side by side. In some embodiments, the two dies 25 are different types of dies or the same types of dies and may be application-specific integrated circuit (ASIC) chips, analog chips, sensor chips, wireless and radio frequency chips, voltage regulator chips or memory chips. In some other embodiments, the two dies 25 are two small die partitions with different function of a larger single die. The sidewalls of the two dies 25 are encapsulated by the encapsulant 23. The two dies 25 are electrically coupled to each other though the RDL structure 40. The forming method and the structural characteristics of the RDL structure 40 are similar to as those of one of the RDL structures 40/140 in the above embodiments. The dielectric layer 12 and the adhesive layer 13 may be selectively removed. In some embodiments in which the dielectric layer 12 and the adhesive layer 13 are remained, the dielectric layer 12 may be connected to a thermal interface material (TIM). Further, in FIG. 9, there has no TIVs formed aside the two dies 25, but the TIVs may be selectively formed aside the two dies 25 (not shown). In some other embodiments, TIVs are formed aside the two dies 25 (not shown) like those in the above embodiments, the dielectric layer 12 and the adhesive layer 13 are remained, one or multiple openings may be formed in the dielectric layer 12 to expose a portion of the TIV, the package structure 50e may further electrically coupled to other package structures to form a POP device.

In the above embodiments, the RDL structure 40/140 is disposed on the front side (the opposite side to the back side) of the die 25. But the disclosure is not limited thereto, and the RDL structure 40/140 may also be disposed on the back side of the die 25, or on both the front side and the back side of the die 25.

In summary, in the disclosed package structure, because the via hole is formed after the trench is formed and is disposed at an end of the trench, as well as the conductive layer and the seed layer on the top surface of the dielectric layer are removed to form the embedded RDL, and there is no via pad formed on the via of the RDL. The problem of misalignment and the undercut of the via pad may be avoided. Moreover, the RDL is embedded in the dielectric layer and the top surface thereof is substantially level with the top surface of the dielectric layer. Since the via of the RDL is embedded in the dielectric layer and does not extend to cover the top surface of the dielectric layer, the size of the via is effectively reduced. That is, when the via pitch of RDLs is constant, since the via of the disclosure has a relatively small size, the spacing for the traces is increased, more traces can pass through the adjacent two vias.

In accordance with some embodiments of the disclosure, a package structure includes a die, an encapsulant and a RDL structure, the encapsulant encapsulate sidewalls of the die. The RDL structure is disposed on the die and the encapsulant. The RDL structure includes a first dielectric structure and a first redistribution layer. The first dielectric structure includes a first dielectric material layer and a second dielectric material layer on the first dielectric material layer. The first redistribution layer is embedded in the first dielectric structure and electrically connected to the die, the redistribution layer comprises a first seed layer and a first conductive layer disposed on the first seed layer. A topmost surface of the first seed layer and a topmost surface of the first conductive layer are substantially level with a top surface of the second dielectric material layer.

In accordance with some embodiments of the disclosure, a method of forming a package structure includes: providing a die; forming an encapsulant to encapsulate sidewalls of the die; forming a first dielectric material layer on the die and the encapsulant; forming a second dielectric material layer on the first dielectric material layer; forming a trench in the second dielectric material to expose a top surface of the first dielectric material layer; forming a via hole penetrating through the second dielectric material layer and the first dielectric material layer to expose a connector of the die; and forming a redistribution layer in the trench and the via hole to electrically connect to the die.

In accordance with alternative embodiments of the disclosure, a method of forming a package structure includes: providing a die; forming an encapsulant to laterally encapsulate the die; forming a dielectric layer on the die and the encapsulant; forming a recess in the dielectric layer to expose a connector of the die; forming a seed layer in the recess and on a top surface of the dielectric layer; forming a conductive layer on the seed layer, wherein an orthographic projection area of the conductive layer on the top surface of the dielectric layer is less than an orthographic projection area of the seed layer on the top surface of the dielectric layer; and removing excess portions of the conductive layer and the seed layer over the top surface of the dielectric layer to expose a portion of the top surface of the dielectric layer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A method of forming a package structure, comprising: providing a die;
forming an encapsulant to encapsulate sidewalls of the die;
forming a first dielectric material layer on the die and the encapsulant;
forming a second dielectric material layer on the first dielectric material layer;
forming a trench in the second dielectric material to expose a top surface of the first dielectric material layer;
forming a via hole penetrating through the second dielectric material layer and the first dielectric material layer to expose a connector of the die; and
forming a redistribution layer in the trench and the via hole to electrically connect to the die.

2. The method of claim 1, wherein forming the trench in the second dielectric material layer comprises:
performing a removal process to remove a portion of the second dielectric material layer, wherein the first dielectric material layer serves as a stop layer of the removal process.

3. The method of claim 2, wherein the removal process includes exposure and development processes, lithography and etching processes, or irradiation with a laser beam.

4. The method of claim 1, wherein a depth of the trench is formed to be substantially the same as a thickness of the second dielectric material layer.

5. The method of claim 1, wherein the via hole is formed at an end of the trench and in spatial communication with the trench.

6. The method of claim 1, wherein forming the redistribution layer comprises:
forming a seed layer lining sidewalls of the second dielectric material layer, sidewalls and the top surface of the first dielectric material layer that defines the via hole and the trench; and
forming a conductive layer on the seed layer.

7. A method of forming a package structure, comprising: providing a die;
forming an encapsulant to laterally encapsulate the die;
forming a dielectric layer on the die and the encapsulant;
forming a recess in the dielectric layer to expose a connector of the die;
forming a seed layer in the recess and on a top surface of the dielectric layer;
forming a conductive layer on the seed layer, wherein an orthographic projection area of the conductive layer on the top surface of the dielectric layer is less than an orthographic projection area of the seed layer on the top surface of the dielectric layer; and
removing excess portions of the conductive layer and the seed layer over the top surface of the dielectric layer to expose a portion of the top surface of the dielectric layer.

8. The method of claim 7, further comprising:
forming a mask layer over the top surface of the dielectric layer to cover a portion of the seed layer, and the conductive layer is formed on other portion of the seed layer exposed by the mask layer; and
removing the mask layer after forming the conductive layer.

9. The method of claim 7, wherein removing the excess portions of the conductive layer and the seed layer comprises:
removing a first portion of the seed layer exposed by the conductive layer through an etching process; and
performing a chemical mechanical polishing (CMP) process to remove the excess portions of the conductive layer and a second portion of the seed layer underlying the excess portions of the conductive layer.

10. The method of claim 7, wherein the excess portions of the seed layer comprises a first portion exposed by the conductive layer and a second portion covered by the excess portions of the conductive layer, wherein the excess portions of the conductive layer and both the first portion and the second portion of the excess portions of the seed layer are removed by a CMP process.

11. The method of claim 7, wherein after removing the excess portions of the seed layer and the conductive layer, remaining portions of the seed layer and the conductive layer in the recess constitute a redistribution layer electrically connected to the die, wherein topmost surfaces of the remaining portions of the seed layer and the conductive layer are substantially level with the top surface of the dielectric layer.

12. A method of forming package structure, comprising: providing a die;
forming an encapsulant, encapsulating sidewalls of the die; and
forming a redistribution layer (RDL) structure on the die and the encapsulant, wherein the RDL structure comprises:
forming a first dielectric structure comprising a first dielectric material layer and a second dielectric material layer on the first dielectric material layer; and
forming a first redistribution layer, embedded in the first dielectric structure and electrically connected to the die, the first redistribution layer comprises a first seed layer and a first conductive layer disposed on the first seed layer, wherein a topmost surface of the first seed layer and a topmost surface of the first conductive layer are substantially level with a top surface of the second dielectric material layer.

13. The method of claim 12, wherein the first conductive layer is surrounded by the first seed layer and separated from the first dielectric structure.

14. The method of claim 12, wherein forming the first redistribution layer comprises:
   forming a via through the first dielectric structure and electrically connected to a connector of the die; and
   forming a trace embedded in the second dielectric material layer and connected to the via, wherein the trace is in contact with a top surface of the first dielectric material layer.

15. The method of claim 14, wherein the via comprises a first portion of the first seed layer and a first portion of the first conductive layer disposed in a via hole penetrating through the second dielectric material layer and the first dielectric material layer; and
   the trace comprises a second portion of the first seed layer and a second portion of the first conductive layer disposed in a trench disposed in the second dielectric material layer.

16. The method of claim 14, wherein the via comprises a first sidewall extending from the top surface of the second dielectric material layer to a bottom surface of the first dielectric material layer, and a second sidewall extending from a top surface of the first dielectric material layer to a bottom surface of the first dielectric material layer.

17. The method of claim 12, wherein a top surface of the first dielectric material layer is in contact with a bottom surface of the first seed layer.

18. The method of claim 12, wherein the first dielectric material layer and the second dielectric material layer comprise different materials.

19. The method of claim 12, wherein forming the RDL structure further comprises:
   forming a second dielectric structure disposed on the first dielectric structure; and
   forming a second redistribution layer, penetrating through the second dielectric structure and electrically connected to the first redistribution layer,
   wherein a bottom surface of the second dielectric structure is in contact with the first seed layer of the first redistribution layer.

20. The method of claim 19, wherein the second redistribution layer comprises a second seed layer and a second conductive layer on the second seed layer, and a topmost surface of the second seed layer and a topmost surface of the second conductive layer are substantially level with a top surface of the second dielectric structure.

* * * * *